(12) United States Patent
e Silva et al.

(10) Patent No.: US 8,245,167 B1
(45) Date of Patent: Aug. 14, 2012

(54) BRANCH AND BOUND TECHNIQUES FOR COMPUTATION OF CRITICAL TIMING CONDITIONS

(75) Inventors: Luis Guerra e Silva, Lisbon (PT); Luis Miguel Silveira, Lisbon (PT); Joel Phillips, Oakland, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 369 days.

(21) Appl. No.: 12/371,579

(22) Filed: Feb. 14, 2009

Related U.S. Application Data

(60) Provisional application No. 61/028,901, filed on Feb. 14, 2008, provisional application No. 61/031,007, filed on Feb. 24, 2008.

(51) Int. Cl.
*G06F 17/50* (2006.01)
(52) U.S. Cl. ........................ 716/113; 716/108; 716/134
(58) Field of Classification Search .................. 716/108, 716/113, 134
See application file for complete search history.

(56) References Cited

U.S. PATENT DOCUMENTS

| | | | |
|---|---|---|---|
| 4,827,428 A * | 5/1989 | Dunlop et al. ................. | 716/113 |
| 7,093,219 B1 * | 8/2006 | Hutton ........................... | 716/113 |
| 7,469,394 B1 * | 12/2008 | Hutton et al. .................. | 716/113 |
| 7,584,443 B1 * | 9/2009 | Govig et al. ................... | 716/113 |
| 7,882,471 B1 * | 2/2011 | Kariat et al. ................... | 716/113 |
| 2005/0066298 A1 * | 3/2005 | Visweswariah .................. | 716/6 |
| 2007/0143722 A1 * | 6/2007 | Venkateswaran et al. ........ | 716/6 |

OTHER PUBLICATIONS

Ababei et al., "Timining Minimization by Statistical Timing hMetis-based Partitioning", Jan. 2003, Proceedings of the 16th International Conference on VLSI Design, pp. 58-63.*
Agarwal et al., "Statistical Timing Analysis Using Bounds and Selective Enumeration", Sep. 2003, IEEE Transactions on Computer-Aided Design of INtegrated Circuits and Systems, vol. 2, iss. 9, pp. 1243-1260.*

(Continued)

*Primary Examiner* — Sun Lin
(74) *Attorney, Agent, or Firm* — Alford Law Group, Inc.; William E. Alford

(57) ABSTRACT

In one embodiment of the invention, a method for electronic circuit design is disclosed. The method includes analyzing a hierarchy of a netlist of a circuit to determine primary inputs and primary outputs of the circuit at an upper level, and internal vertices of the circuit at lower levels between the primary inputs and the primary outputs; forming a timing graph of the circuit including a plurality of timing delay edges representing timing delay between the primary inputs, the internal vertices and the primary outputs to form a plurality of paths of a path space from the primary inputs to the primary outputs; and in response to the timing delay of the plurality of timing delay edges, dynamically pruning paths of the plurality of paths using branch and bound techniques on bounds of timing delay that are a function of one or more circuit parameters to reduce the path space down to one or more critical timing paths of the circuit with a worse case metric of timing delay between the primary inputs and the primary outputs. Additionally or alternatively, timing in the circuit may be analyzed to determine a bound of timing delay of the circuit for one or more parameter corners in a parameter space and if the bound of timing delay is worse than a threshold time delay then one or more parameter corners may be pruned from the parameter space using branch and bound techniques.

23 Claims, 18 Drawing Sheets

OTHER PUBLICATIONS

Bozorgzadeh et al., "Optimal Integer Delay-Budget Assignment on Directed Acyclic Graphs", Aug. 2004, IEEE Transactions on Computer-Aided Design of Integrated Circuit and Systems, vol. 23, iss. 8, pp. 1184-1199.*

Wang et al., "Critical Path Selection for Delay Fault Testing Based Upon a Statistical Timing Model", Nov. 2004, IEEE Transactions on Computer-Aided Design of Integrated Circuits and Systems, vol. 23, iss. 11, pp. 1550-1565.*

Wang et al., A Novel Criticality Computation Method in Statistical Timing Analysis, Apr. 2007, Design, Automation & Test in Europe Conference & Exhibition, 2007. Date '07, pp. 1-6.*

C. Visweswariah, K. Ravindran, K. Kalafala, S. G. Walker, and S. Narayan. First-Order Incremental Block-Based Statistical Timing Analysis. In Proceedings of the ACM/IEEE Design Automation Conference, San Diego, CA, Jun. 2004, pp. 331-336.

Lou Scheffer, Explicit Computation of Performance as a Function of Process Variation. In TAU'02, Monterey, CA., Dec. 2002, 8 pages.

* cited by examiner

```
1:  function WDC-PATH-BNB(G)
2:      w* ← 0                                  ▷ Worst delay
3:      Δλ ← ◇                                  ▷ Worst corner
4:      INITIALIZE_(G)
5:      for all v ← PO(G) do
6:          <w, Δλ> ← PROCESS-VERTEX (G, v, w*, 0)
7:          if w>w* then
8:              <w, Δλ*> ← <w, Δλ>
9:          end if
10:     end for
11:     return <w, Δλ*>
12: end function
```

FIG. 8

```
1:  function PROCESS-VERTEX (G, v, w*, d^out)
2:      d_v^in ← IN-DELAY-ESTIMATE(v)
3:      d_v^path ← d_v^in + d_v^out
4:      <w, Δλ> ← max_Δλ [d_v^path]
5:      if w≤w* then                            ▷ Fanin cons gets pruned
6:          return <w*, 0> ← PROCESS-VERTEX (G, v, w*, 0)
7:      else if v ∈ PI(G) then                  ▷ Worst delay is updated
8:          return <w, Δλ> ← <w, Δλ>
9:      else
10:         for all e ← INCOMING-EDGES( v ) do
11:             s ← SOURCE VERTEX(e)            ▷ Get edge source vertex
12:             d_e ← DELAY(e)
13:             d_v^out ← d_v^out + d_e
14:             <w, Δλ> PROCESS-VERTEX (G, s, w* d_s^out )
15:             if w>w* then
16:                 <w*, Δλ*> ← <w, Δλ>
17:             end if
18:         end for
19:         return <w*, Δλ>
21: end function
```

FIG. 9

| v | trail | $d_v^{path}$ | w | Δλ | w* | Δλ* |
|---|---|---|---|---|---|---|
| g | 0 | $5 + 3\Delta\lambda_1 + 2\Delta\lambda_2$ | 0 | 0 | 0 | 0 |
| e | (e,g) | $5 + 2\Delta\lambda_2$ | 7 | (X,1) | 0 | 0 |
| a | (a,e),(e,g) | $5 + 2\Delta\lambda_2$ | 7 | (X,1) | 7 | (X,1) |
| b | (b,e),(e,g) | $5 - \Delta\lambda_1 + \Delta\lambda_2$ | 6 | (0,1) | 7 | (X,1) |
| f | (f,g) | $3 + 3\Delta\lambda_1 - 2\Delta\lambda_2$ | 6 | (1,0) | 7 | (X,1) |

```
1:  function WDC-PARAMETER-BNB(G)              ▷ Worst delay
2:      w* ← 0                                 ▷ Worst corner
3:      Δλ ← <>
4:      T ← DT-INIT()
5:      while Δλ ← DECIDE (T) do
6:          DT-REGISTER-DECISION (T, Δλ )
7:          w ← WORST-DELAY (G, Δλ )
8:          if w>w* then
9:              DT-REFISTER-PRUNET (T, Δλ )
10:         else if IS-COMPALETE ( Δλ ) then
11:             <w*, Δλ *> ← <w, Δλ >
12:         end if
13:     end while
14:     return <w*, Δλ *>
15: end function
```

FIG. 12

| $\Delta\lambda_1$ | $\Delta\lambda_2$ | delay |
|---|---|---|
| 0 | X | $5 + 2\Delta\lambda_2$ |
| 1 | X | $6 + 2\Delta\lambda_2$ |
| X | 0 | $5 + 3\Delta\lambda_1$ |
| X | 1 | $7 + 3\Delta\lambda_1$ |
| 0 | 0 | 5 |
| 0 | 1 | 7 |
| 1 | 0 | 6 |
| 1 | 1 | 7 |

-in late mode: $\max_{\Delta\lambda} \left\{ \max_{j=1,...,m} \left[ \max_{i=1...,n} d_{i,j}^{late}(\Delta\lambda) \right] \right\}$ -in late mode: $\min_{\Delta\lambda} \left\{ \min_{j=1,...,m} \left[ \min_{i=1...,n} d_{i,j}^{early}(\Delta\lambda) \right] \right\}$

BRANCH AND BOUND TECHNIQUES FOR COMPUTATION OF CRITICAL TIMING CONDITIONS

CROSS REFERENCE TO RELATED APPLICATIONS

This patent application incorporates by reference and claims the benefit of U.S. Provisional Patent Application Nos. 61/028,901 entitled "COMPUTATION OF CRITICAL TIMING CONDITIONS" filed on Feb. 14, 2008 by inventor Luis Guerra e Silva et al; and U.S. Provisional Patent Application Nos. 61/031,007 entitled "BRANCH AND BOUND TECHNIQUES FOR COMPUTATION OF CRITICAL TIMING CONDITIONS" filed on Feb. 24, 2008 by inventor Luis Guerra e Silva et al.

FIELD OF INVENTION

The embodiments of the invention relate generally to timing analysis of integrated circuits.

BACKGROUND

As feature sizes in integrated circuit technology decrease to nanometer scale, the impact of process and operational parameter variations in circuit performance is significant. Therefore, it becomes extremely relevant to be able to accurately identify, for a given circuit, what parameter settings (commonly designated by corners) will degrade its performance the most. Important performance metrics are timing and power. In this context, our invention provides a run time and memory efficient way of computing the set of assignments for process and operational parameters that will produce the critical timing conditions on a given digital integrated circuit.

Prior solutions rely on exhaustive approaches that explicitly explore the entire solution space, by evaluating every possible solution, and choosing the one that produces the critical timing conditions.

Exhaustive approaches are slow, because in most cases the size of the solution space is exponential (either in the number of paths or in the number of parameters), and therefore an explicit enumeration and evaluation of every possible solution is computationally too expensive to permit any practical use, even in moderately sized circuits.

BRIEF SUMMARY

The embodiments of the invention are best summarized by the claims that follow below. However, the embodiments of the invention are briefly described in this section In one embodiment of the invention, a method of analyzing an electronic circuit design is disclosed including analyzing a hierarchy of a netlist of a circuit; forming a timing graph of the circuit; and in response to the timing delay of a plurality of timing delay edges, dynamically pruning paths of the plurality of paths using branch and bound techniques to reduce the path space down to one or more critical timing paths of the circuit. The hierarchy of the netlist of the circuit is analyzed to determine one or more primary inputs (PI) and one or more primary outputs (PO) of the circuit at an upper level, and one or more internal vertices of the circuit at lower levels between the one or more primary inputs (PI) and the one or more primary outputs (PO). The timing graph includes a plurality of timing delay edges representing timing delay between the one or more primary inputs (PI), the one or more internal vertices, and the one or more primary outputs (PO) to form a plurality of paths of a path space from the one or more primary inputs (PI) to the one or more primary outputs (PO). The dynamic pruning is performed on bounds of timing delay that are a function of one or more circuit parameters to reduce the path space down to the one or more critical timing paths of the circuit that have a worse case metric of timing delay between the one or more primary inputs (PI) and the one or more primary outputs (PO).

In another embodiment of the invention, an apparatus for electronic circuit design is disclosed including one or more processors to execute machine readable instructions stored in a machine readable medium to analyze a circuit design. The machine readable instructions stored in the machine readable medium include instructions to analyze a hierarchy of a netlist of a circuit to determine one or more primary inputs (PI) and a plurality of primary outputs (PO) of the circuit at an upper level, and one or more internal vertices of the circuit at lower levels between the one or more primary inputs (PI) and the plurality of primary outputs (PO); instructions to form a timing graph of the circuit including a plurality of timing delay edges representing timing delay between the one or more primary inputs (PI), the one or more internal vertices and the one or more primary outputs (PO); instructions to add a super primary output (SPO) to the timing graph of the circuit with timing delay edges having zero timing delay coupled to the plurality of primary outputs (PO) to form a plurality of paths of a path space from the one or more primary inputs (PI) to the super primary output (SPO); and instructions, responsive to the timing delay of the plurality of timing delay edges, to dynamically prune paths of the plurality of paths using branch and bound techniques on bounds of timing delay that are a function of one or more circuit parameters to reduce the path space down to one or more critical timing paths of the circuit with a worse case metric of timing delay between the one or more primary inputs (PI) and the super primary output (SPO).

In yet another embodiment of the invention, a method of analyzing an electronic circuit design is disclosed. The method of analyzing the electronic circuit design includes analyzing a hierarchy of a netlist of a sequential circuit to determine one or more primary inputs (PI) and one or more primary outputs (PO) of a combinational circuit at an upper level, and one or more internal vertices of the combinational circuit at lower levels between the one or more primary inputs (PI) and the one or more primary outputs (PO); forming a timing graph of the combinational circuit including a plurality of timing delay edges representing timing delay between the one or more primary inputs (PI), the one or more internal vertices and the one or more primary outputs (PO) to form a plurality of paths of a path space from the one or more primary inputs (PI) to the one or more primary outputs (PO); adding one or more registered inputs (RI) to the timing graph of the circuit with timing delay edges having a clock input latency, the one or more registered inputs (RI) respectively coupled to the one or more primary inputs (PI) by the timing delay edges; adding one or more registered outputs (RO) to the timing graph of the circuit with timing delay edges having timing delay including a register timing and a clock output latency, the one or more registered outputs (RO) respectively coupled to the one or more primary outputs (PO) by the timing delay edges; wherein the one or more registered inputs (RI), the one or more primary inputs (PI), the one or more internal vertices, the one or more primary outputs (PO), and the one or more registered outputs (RO) to form a plurality of paths of a path space from the one or more registered inputs (RI) to the one or more registered outputs (RO); and in response to the timing delay of the plurality of timing delay edges, dynamically pruning paths of the plurality of paths using branch and bound techniques on bounds of timing delay that are a function of one or more circuit parameters to reduce the path space down to one or more critical timing paths of the circuit with a worse case metric of slack between the one or more registered inputs (RI) and the one or more registered outputs (RO).

In still other embodiments of the invention, other methods for analyzing an integrated circuit design are disclosed. Another method for analyzing an integrated circuit design includes analyzing timing in a circuit using one or more parameter corners in a parameter space to determine a bound of timing delay of the circuit for the one or more parameter corners; determining if the bound of timing delay is worse than a threshold time delay; and if the bound of timing delay is worse than the threshold time delay, then pruning the one or more parameter corners from the parameter space using branch and bound techniques.

In still another embodiment of the invention, a machine readable product is disclosed having a machine readable storage device with machine readable program instructions stored therein. The instructions stored in the storage device include machine readable program instructions to analyze timing in a circuit using one or more parameter corners in a parameter space to determine a bound of timing delay of the circuit for the one or more parameter corners; machine readable program instructions to determine if the bound of timing delay is worse than a threshold time delay; and machine readable program instructions to prune the one or more parameter corners from the parameter space using branch and bound techniques if the bound of timing delay is worse than the threshold time delay.

BRIEF DESCRIPTION OF DRAWINGS

FIG. 8 is a listing of pseudocode for the algorithm for path space exploration using Branch-and-Bound technique.

FIG. 9 is a listing of pseudocode for the execution of function "PROCESS-VERTEX".

FIG. 12 is a listing of pseudocode for the algorithm for parameter space exploration using Branch-and-Bound technique.

DETAILED DESCRIPTION

Figure 1:
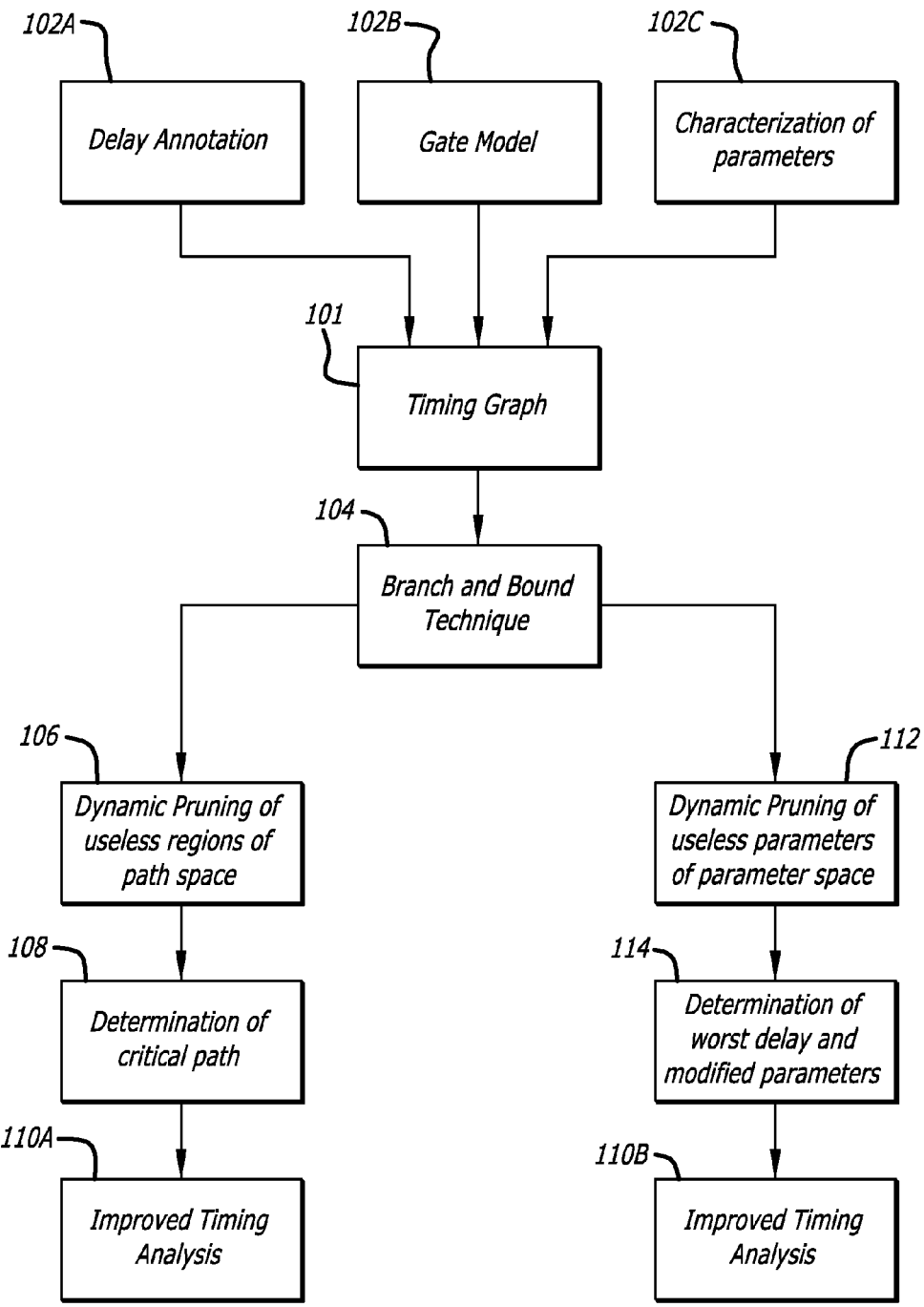
FIG. 1 is a flow diagram illustrating some embodiments of the invention.

In the following detailed description of the embodiments of the invention, numerous specific details are set forth in order to provide a thorough understanding of the embodiments of the invention. However, the embodiments of the invention may be practiced without these specific details. In other instances well known methods, procedures, components, and circuits have not been described in detail so as not to unnecessarily obscure aspects of the embodiments of the invention.

Introduction

Combinatorial optimization is a branch of optimization in applied mathematics and computer science. It is related to operations research, algorithm theory and computational complexity theory that sit at the intersection of several fields, including artificial intelligence, mathematics and software engineering. Combinatorial optimization algorithms solve instances of problems, by exploring the usually-large solution space. Combinatorial optimization algorithms achieve this by reducing the effective size of the space, and by exploring the space efficiently.

Branch and bound technique is a general algorithm for finding optimal solutions of various optimization problems, especially in discrete and combinatorial optimization. Starting by considering the root problem (the original problem with the complete feasible region), the lower-bounding and upper-bounding procedures are applied to the root problem. If the bounds match, then an optimal solution has been found and the procedure terminates. Otherwise, the feasible region is divided into two or more regions, these sub-problems partition the feasible region. The algorithm is applied recursively to the sub-problems. If an optimal solution is found to a sub-problem, it is a feasible solution to the full problem, but not necessarily globally optimal. If the lower bound for a node exceeds the best known feasible solution, no globally optimal solution exist in the subspace of the feasible region represented by the node. Therefore, the node can be removed from consideration. The search proceeds until all nodes have been solved or pruned, or until some specified threshold is met between the best solution found and the lower bounds on all unsolved sub-problems.

Breadth-first traversal is a graph search algorithm that begins at the root node and explores all the neighboring nodes. Then for each of those nearest nodes, it explores their unexplored neighbor nodes, and so on, until it finds the goal. Depth-first traversal is a search algorithm of a tree that explores the first child of a node before visiting its siblings. A depth-first traversal of a tree always starts at the root of the tree.

Process-aware critical timing conditions are computed for a digital integrated circuit, when cell and interconnect delays are characterized by functions of process and operational parameters. Statistical static timing analysis (SSTA) has been recently introduced as a form of incorporating variability effects in traditional static timing analysis. The output of statistical timing analysis is a set of delay or arrival time distribution that provides a statistical view over the timing behavior of a circuit. Even though SSTA may not be a mature methodology, the parametric delay and slew formulations that it prescribes may be used to accurately determine the parameter settings that correspond to the critical timing conditions of a circuit.

It is impossible to analyze a design for all possible parameter settings, due to the exponential size of the parameter space; the design is usually analyzed for a small set of carefully selected settings that are expected to cover the worst case fabrication and operation scenarios. These settings are usually designated by corners, since they correspond to extreme conditions.

An automated methodology is disclosed for computing the critical timing process corner of a digital integrated circuit, given a parametric characterization of the gate and interconnect delays. In the embodiments of the invention, parameters are characterized by their respective value ranges, as opposite to statistical timing analysis where they are characterized by statistical distributions. Additionally, the embodiments of the invention produce meaningful and insightful information for the designer, like parameter settings (corners) and specific circuit paths where they induce critical timing conditions, which makes it much more useful in effectively guiding manual or automated circuit optimization than other approaches, like statistical timing analysis.

The timing information of a circuit may be modeled by a timing graph, where vertices correspond to nodes and/or pins in the circuit, and edges to pin-to-pin delays in cells or interconnect. Each edge is annotated with the corresponding delay. Further, some vertices are annotated with timing constraints, such as required arrival times. The timing graph is the result of a delay calculation procedure, where usually slews are forward propagated across the circuit and, using appropriate cell and interconnect models, the delays and output slews for each component are computed.

In a typical timing analysis methodology delay computation usually precedes arrival time computation, even though in many cases they are performed simultaneously. Arrival time computation is concerned with computing the time instants at which signal transitions reach "interesting" vertices in the timing graph (pins in the circuit), most often corresponding to primary outputs or register inputs, where specific timing constraints must be enforced, and therefore validated. For constant real-valued delays, if conservative arrival time estimates are acceptable, their computation can be trivially performed by pushing arrival times through the timing graph in a levelized fashion, and performing sum operations over the edges and max operations over the vertices. This approach is commonly termed block-based timing analysis, and its runtime is linear in the number of vertices in the timing graph. An alternative technique is path-based analysis, where the delay of each path is computed individually, by adding the delay of each of its edges. Even though more accurate, this approach is computationally much more expensive than the former, since the number of paths is known to grow exponentially with the number of vertices (pins).

Timing Graphs and Paths

In the embodiments of the invention, a timing graph is considered to be a directed acyclic graph, $G=(V, E)$, composed of vertices, $v \in V$, and directed edges (delay edges), $e \in E$, connecting two vertices together. V is the set of vertices and E is the set of edges. Vertices without incoming edges may be primary inputs PI. Vertices without outgoing edges may be primary outputs PO. However, depending upon circumstances, a timing graph may have primary outputs with outgoing edges. The timing graph G has a set of one or more primary inputs PI(G) and a set of one or more primary outputs PO(G). A complete path is a sequence of edges, connecting a primary input vertex to a primary output vertex and may be referred to herein simply as a path. A partial path is a sequence of one or more edges connecting any two vertices.

Figure 17A:
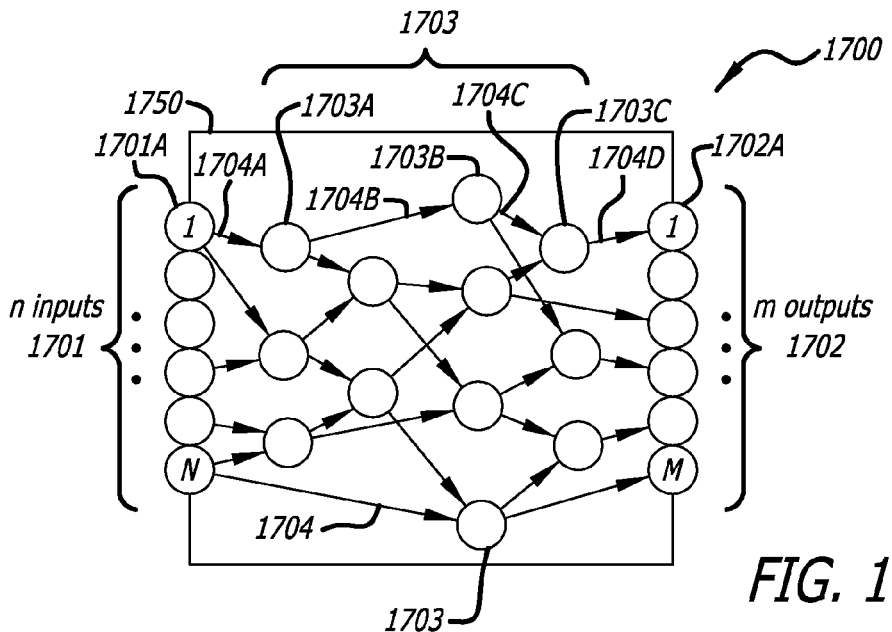
FIG. 17A is a diagram of a timing graph for a combinational block illustrating an exemplary path space.
Figure 17B:
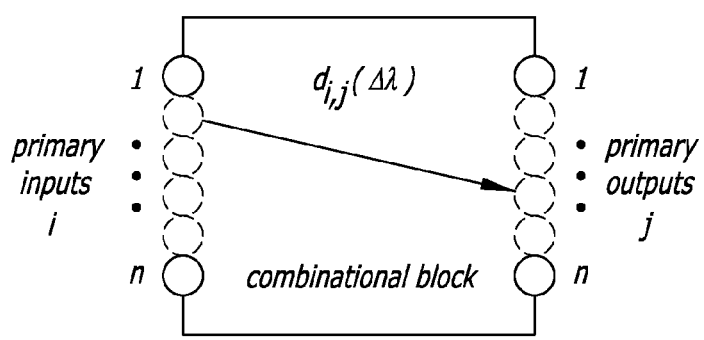
FIG. 17B is a pictorial illustration of computation of the worst delay corner in late mode and early mode.

FIG. 17A illustrates an exemplary timing graph 1700 corresponding to circuitry of a combinational functional block 1750. As described herein, the timing graph of a combination functional block may be expanded into a timing graph of a synchronous functional block with proper modeling of registers and the respective hold slack and setup slack timing. The exemplary timing graph 1700 includes N primary inputs 1701, M primary outputs 1702, one or more internal vertices 1703, with one or more directed edges (delay edges) 1704 connecting the vertices together. The one or more internal vertices 1703 of the timing graph may correspond to nodes of the circuit while the N primary inputs 1701 and the M primary outputs 1702 may respectively correspond to input pins and output pins of the circuit in the netlist hierarchy of the combinational functional block. In the path space, the exemplary timing graph 1700 has a set of one or more complete paths between the N primary inputs 1701 and the M primary outputs 1702 formed through the one or more internal vertices 1703 with the one or more directed edges (delay edges) 1704.

Figure 7:
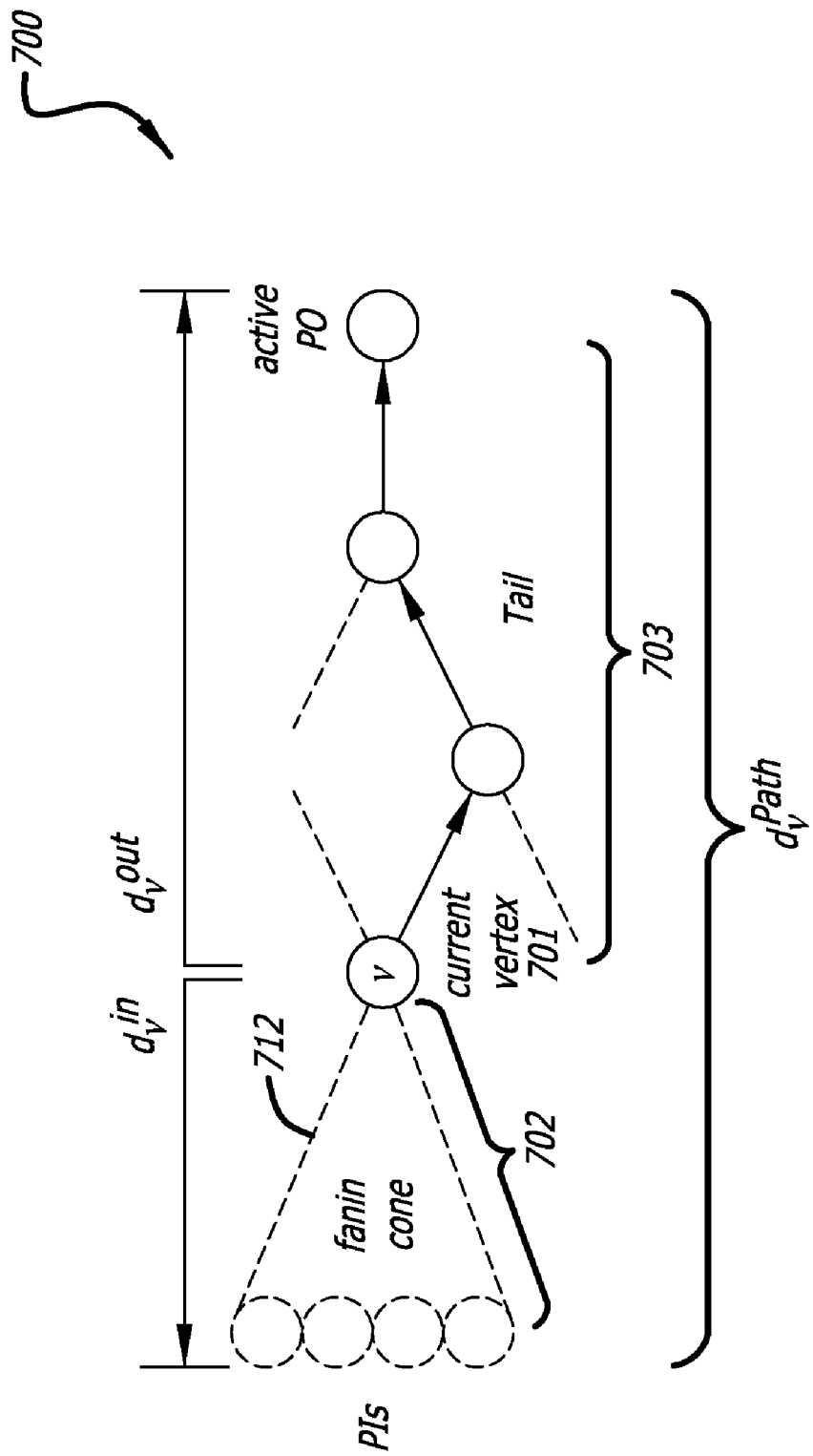
FIG. 7 is a diagram of a portion of a timing graph to illustrate the various delay estimates that may be made.

If a given selected vertex is an internal vertex, it may include one or more fan-in paths from one or more primary inputs, and one or more trail paths to one or more primary outputs. FIG. 7 illustrates one or more fan-in paths 702 and a trail path 703 with an internal vertex 701. In this case, the fan-in paths and the trail path are partial paths given the selected internal vertex 701. However, if a selected vertex selected for analysis in the timing graph is a primary input without incoming edges (e.g., primary input 1701A in FIG. 17A), the trail path (e.g., partial paths/edges 1704A-1704D through vertices 1703A-1703C in FIG. 17A) is a complete path from a primary input (e.g., PI 1701A in FIG. 17A) to a primary output (e.g., PO 1702A in FIG. 17A). Similarly, if a selected vertex selected for analysis in the timing graph is a primary output without outgoing edges (e.g., primary output 1702A in FIG. 17A), the trail path (e.g., partial paths/edges 1704A-1704D through vertices 1703A-1703C in FIG. 17A) is empty. However, an upper bound of timing delay may be used at the primary outputs to simplify the analysis of the timing graph at the primary outputs.

Timing Delays as Affine Functions or Convex Functions of Parameters

In some of the embodiments of the invention, delays are described by affine functions of parameter variations (e.g., process parameter variations, design parameter variations, and operational or environmental parameter variations) instead of assuming constant real-numbered values. These parameter variations correspond to a first-order linearization of every delay, d, around a nominal point, $\lambda_0$, in the parameter space and may be expressed in equation form by equation 1 as follows:

$$d(\lambda - \lambda_0) = d(\lambda_0) + \frac{\partial d}{\partial \lambda}\bigg|_{\lambda_0} (\lambda - \lambda_0) \quad (1)$$

Taking the incremental parameter variation vector by $$\Delta\lambda = \lambda - \lambda_0 \quad (2)$$

and the parameter space of size p, equation (1) may be rewritten as equation (3) as follows $$d(\Delta\lambda) = d_0 + \sum_{i=1}^{p} d_i \Delta\lambda_i = d_0 + d^T \Delta\lambda \quad (3)$$

where $d_o$ is the nominal value of d, computed at the nominal values of the parameters, $\lambda_i$, with i=1, 2, . . . , p, and $d_i$ is the sensitivity of d to parameter $\lambda_i$, computed at the nominal point $\lambda_0$. All the parametric formulas may be normalized such that $\Delta\lambda \in [0,1]^p$ representing a pair of extreme values of the parameter to ease computer computations.

Figure 5A:
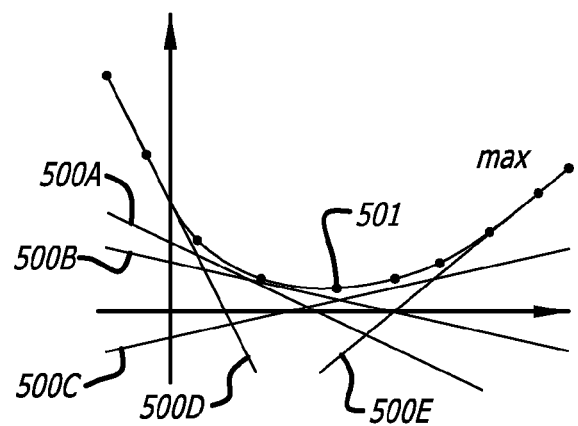
FIGS. 5A-5B are graphical representations of properties of affine functions.
Figure 5B:
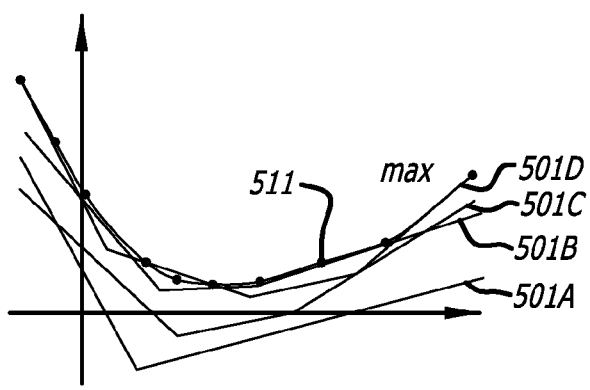

Referring now to FIGS. 5A-5B, a maximum of affine functions 500A-500E is a piecewise-affine function 501 as illustrated in FIG. 5A. A maximum of piecewise-affine functions 501A-501D is also a piecewise-affine function 511. Similarly, the sum of affine functions is an affine function, and the sum of a piecewise-affine function and an affine function is a piecewise-affine function. Therefore, any arrival time may be accurately represented by a piecewise-affine function, since it is the result of a sequence of max and sum operations between piecewise-affine functions and an affine function. If no simplification is performed, the piecewise-affine representation of arrival times grows linearly with the number of paths, and exponential with the number of vertices in the timing graph.

A convex function is a continuous function whose value at the midpoint of any interval does not exceed the average of its values at the ends of the interval. Affine functions are convex in nature. An important property of the max operator over affine functions, or convex piecewise-affine functions, is that it always produces convex functions. The same applies to the sum operator. The convexity implies that the largest value for a given affine or piecewise-affine function is obtained by setting each variable to one of its extreme values. In the context of timing analysis this corresponds to state that the largest delay or arrival time is obtained by setting each parameter to one of its extreme values, in this case either 0 or 1. For the simple case of delays these are represented by affine functions which is fairly easy to compute. Setting 1 to all the parameter variations with positive sensitivities and to 0 the remaining ones, the following maximum value of the affine delay function over the parameter space are obtained, $$\max_{\Delta\lambda}[d(\Delta\lambda)] = d(\Delta\lambda^*) = d_0 + \sum_{i=1}^{p} d_i \Delta\lambda^* \quad (4)$$

where the maximizing parameter variation assignment, $\Delta\lambda^*$, is $$\Delta\lambda^* = \begin{cases} 0 \text{ if } d_i \leq 0 \\ 1 \text{ if } d_i > 0 \end{cases} \text{ where } i = 1, 2, \ldots, p \quad (5)$$

Conversely, the minimum value is computed by replacing $\Delta\lambda_i^*$ with $(1-\Delta\lambda_i^*)$ in Eqn. (4). For affine functions this computation takes linear time in the number of parameters, however, for piecewise-affine functions this computation is much more expensive, since it requires an implicit or explicit enumeration of all the $2^p$ possible solutions (corners), which makes it exponential in the number of parameters.

Figure 6A:
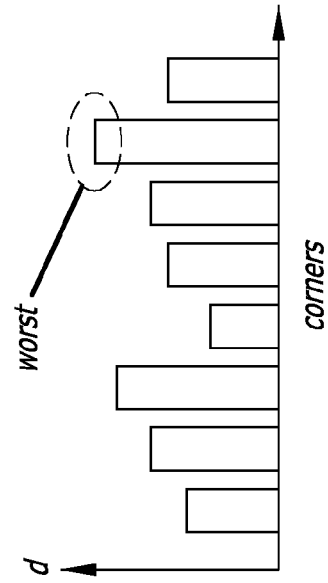
FIGS. 6A-6C are diagrams illustrating a worst delay corner problem and extreme settings of the parameters.
Figure 6B:
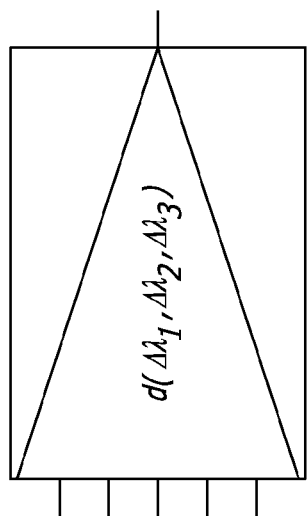
Figure 6C:
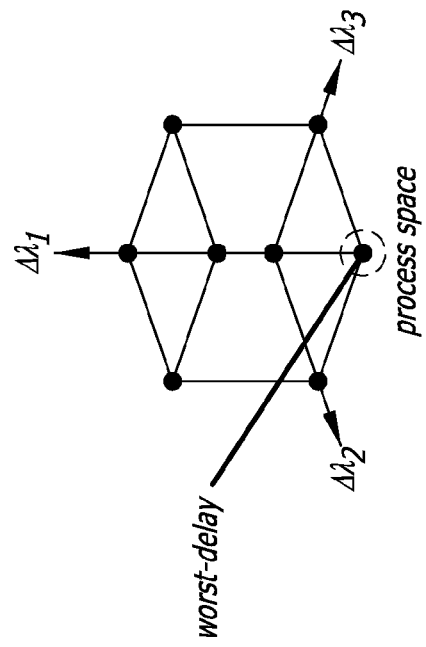

Referring now to FIGS. 6A-6C, diagrams to illustrate a worst delay corner problem and extreme settings of the parameters are shown. The worst-delay corner (WDC) problem consists of computing an assignment to the parameter variation vector, $\Delta\lambda$, that maximizes the largest arrival time (e.g. worst case delay of corners as shown in FIG. 6B) among all the primary outputs of a given circuit. Since the arrival times are represented by piecewise-affine functions, which are convex, their largest value is obtained by setting each parameter variation to one of its extreme values. Therefore, this problem is a combinatorial optimization problem where, by searching in a finite but typically large set of elements, a given cost function is optimized. In this case, the set of elements is the set of all the $2^p$ possible parameter variation assignments, and the cost function is the arrival time at a given primary output. The major difficulty with these types of discrete problems, as opposed to continuous linear problems, is that there is no any optimality conditions to check if a given (feasible) solution is optimal or not. Therefore, in order to conclude that a feasible solution is optimal, its cost is compared with the cost of any other feasible solution. This amounts to always exploring the entire solution space, either explicitly or implicitly, by a complete or partial enumeration of all the feasible solutions and their associated costs.

The simplest exhaustive algorithm that is conceived for computing the WDC is to just evaluate the delay of the circuit for all the $2^p$ possible parameter variation assignments (e.g. corners of process space shown in FIG. 6C), and verify which assignment produces the largest arrival time (e.g. worst case delay of corners as shown in FIG. 6B) at a primary output. This assignment corresponds to the WDC. The block-based timing analysis procedure computes arrival times in linear time of the number of vertices. Since it requires to run such a procedure for each of the $2^p$ parameter variation assignments, the overall algorithm becomes exponential in the number of parameters. However, another possible solution is to instead perform such a search in the path space (e.g., the primary output for primary inputs shown in FIG. 6A). Essentially, this corresponds to performing an exhaustive path-based timing analysis and, for each path, computing the corresponding affine delay function, by adding the delay functions of the edges along that path. Given the affine delay function of a path, the WDC is calculated for that path by applying Eqns. (4) and (5). For each path, the procedure of computing the delay function and obtaining the WDC of the path is linear in the number of parameters. However, since the number of paths can grow exponentially with the number of vertices, and it is required to perform this procedure for every single path, the overall procedure has a worst case exponential complexity in the number of vertices. Hence, both exhaustive methods exhibit exponential run time complexity, either in the number of parameters or in the number of vertices.

Branch and Bound Technique Introduction

Referring now to FIG. 1, a general approach for computing the worst delay corner (WDC) using branch-and-bound techniques is illustrated. A timing graph 101 of a circuit design, including delay annotations 102A, a gate model 102B, and characterization of parameters 102C, is operated upon using branch-and-bound techniques 104 to provide an improved timing analysis. The general approach is to dynamically prune parts of the search space and therefore avoid an explicit enumeration of all the possible solutions. Branch and bound techniques 104 may be used to dynamically prune useless regions of a path space 106 and/or dynamically prune useless parameters, corners, or regions of a parameter space 112. A determination of one or more critical paths 108 and/or a determination of worst case delays with modified parameters 114 may be made in order to achieve improved timing results 110A, 110B. Most combinatorial problems, including the one at hand, is only solved by explicitly or implicitly evaluating a specific, nonlinear, cost function over the entire solution space, in order to compute the solution that yields the optimal cost.

Figures 10A, 10B:
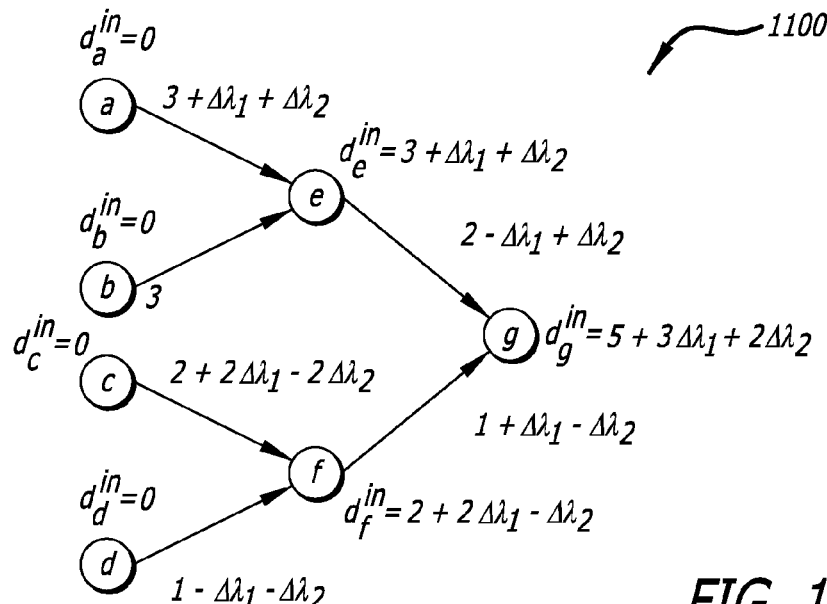
FIG. 10A is an exemplary timing graph to illustrate path space exploration for a combinational circuit.
FIG. 10B is a table of values corresponding to the exemplary timing graph of FIG. 10A.
Figure 11:
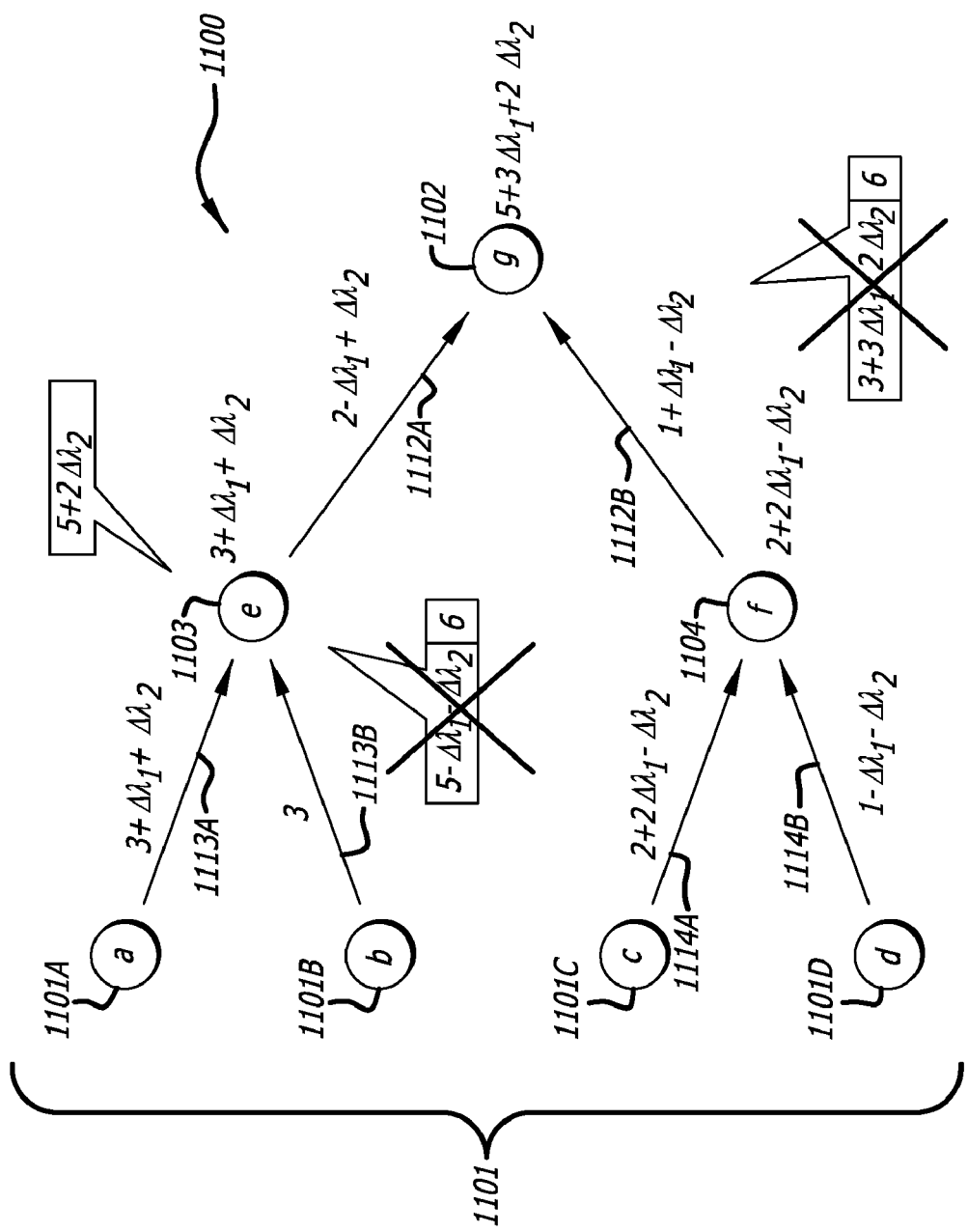
FIG. 11 is an exemplary timing graph similar to that of FIG. 10A to illustrate pruning paths in a path space.

Branch-and-bound techniques focus on pruning useless regions of the solution space 106, 112, as shown in greater detail in FIGS. 10A-10B and 11, thus avoiding the explicit evaluation of all the possible solutions that they may contain. During the execution of the algorithm, the best known value for the cost function is maintained, corresponding to the cost of the best solution already found. If by some simple and quick procedure we are able to determine that the cost of all the solutions contained in a certain subspace is worse than the best known cost, then it is useless to explore that subspace, since no improvement on the cost function will be obtained. Therefore, that portion of the solution space can be pruned, and an explicit enumeration of all the solutions it may contain is avoided. Even though in the worst case this approach can be as bad as the exhaustive enumeration, on average for a wide range of applications, it has proven to perform significantly better.

Branch-and-Bound Algorithm for Path Space Searches

Considering one primary output at a time, designated as the active primary output, the branch-and-bound based (BNB) algorithm performs an implicit search over all the complete paths that end at that output. The timing graph is traversed in a backward fashion, starting at the active primary output, going through the internal vertices, and eventually ending at the primary inputs, if no pruning is performed. The vertex being explored in a certain step is designated by the current vertex. The path taken to reach that vertex from the active primary output is designated by a trail. When reconvergent fanouts exist, the same vertex can be reached from the same primary output, through distinct trails. The largest delay w*, among the complete paths already analyzed is continuously updated, as well as the corresponding parameter variation assignment, $\Delta\lambda^*$.

Referring now to FIG. 7 illustrating a portion of a timing graph 700, for each current selected vertex v 701, the algorithm relies on three parametric delay estimates:

$d_v^{in}$ is an upper bound on the timing delay from any primary input PI to the selected vertex v 701 (e.g., fan-in paths 702 of the fanin cone 712 of the vertex v 701);

$d_v^{out}$ is the timing delay of the trail 703 over the partial path from the vertex v 701 to the selected primary output PO being analyzed;

$d_v^{path} = d_v^{in} + d_v^{out}$ is the upper bound on the timing delay of any complete path going through the selected vertex v 701 that includes the trail 703 to the selected primary output PO. This may be determined by summing the upper bound of timing delay for the one or more fan-in paths 702 of fanin cone 712 with the timing delay of the trail 703.

The rationale underlying this algorithm is that if for a given selected vertex v, the upper bound of the timing delay for complete paths through the selected vertex is less than or equal to the current worse case path delay w*, $\max_{\Delta\lambda} |d_v^{path}| \leq w^*$, then there is no path going through the selected vertex v that includes the trail with a timing delay larger than the current worse case path delay w*. Therefore if this is the case, it would be wasteful to further explore the fanin cone of the given selected vertex v, for the given trail 703.

Figure 2:
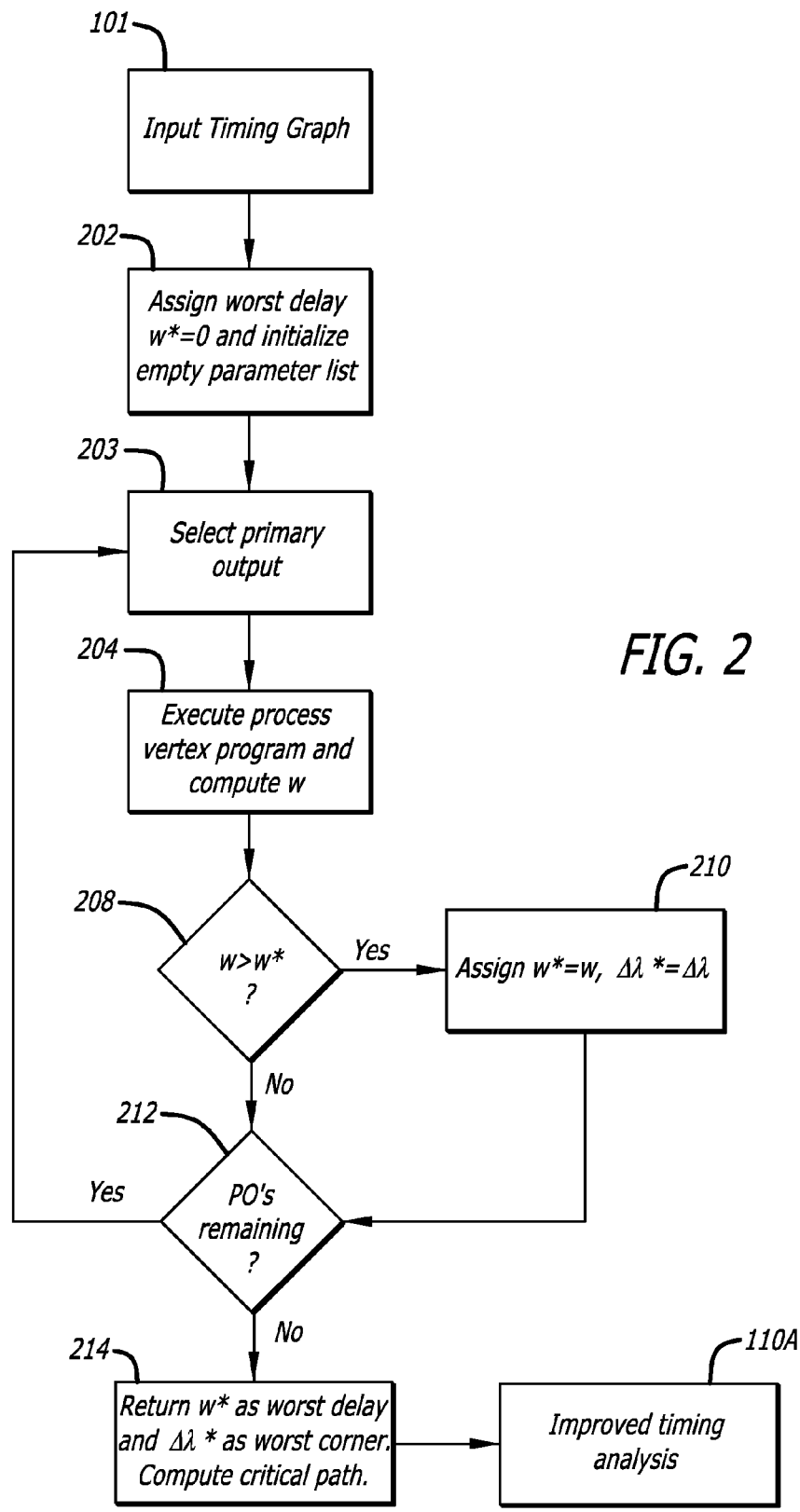
FIG. 2 is a flow chart illustrating path space exploration.
Figure 3:
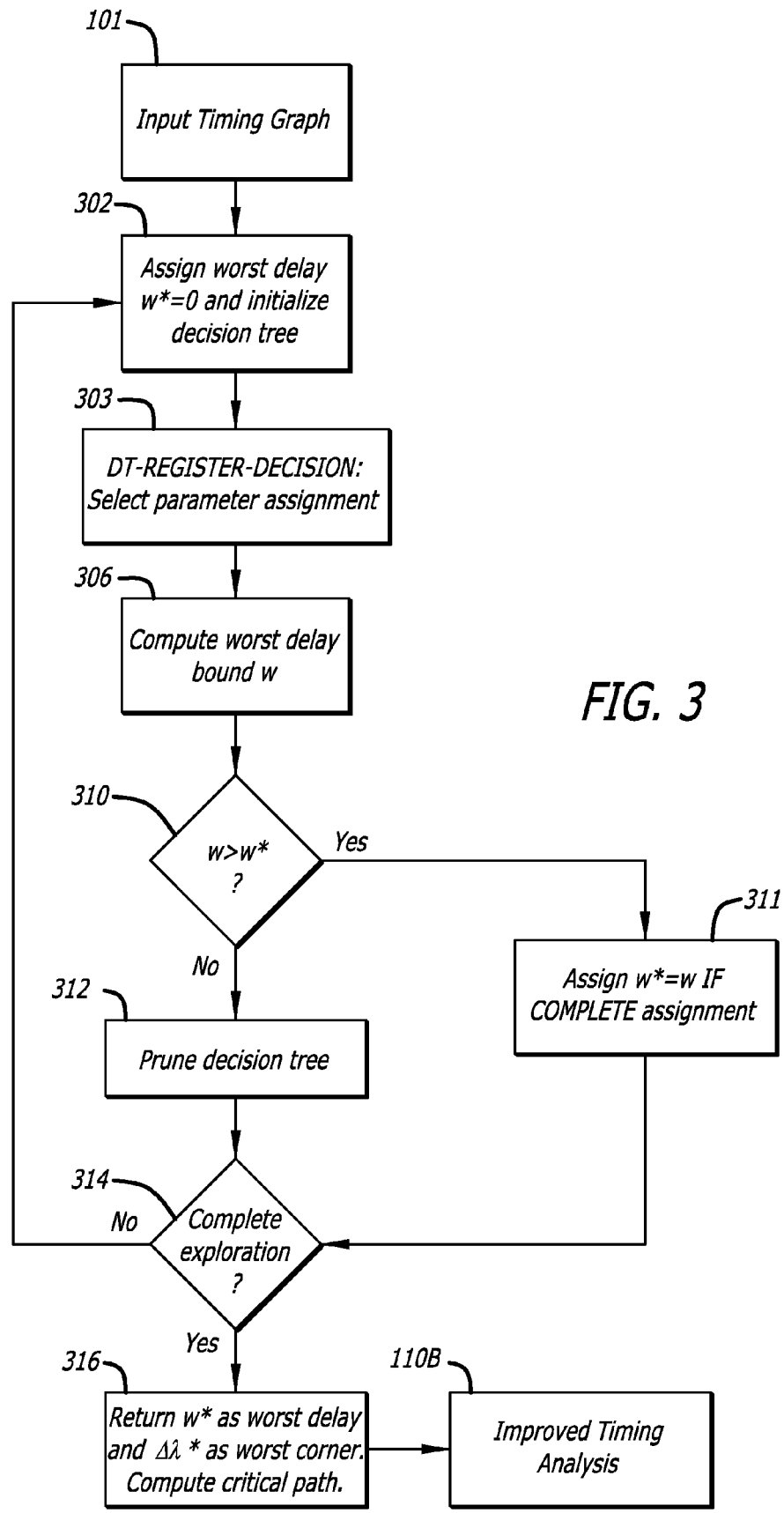
FIG. 3 is a flow chart illustrating parameter space exploration.
Figure 4:
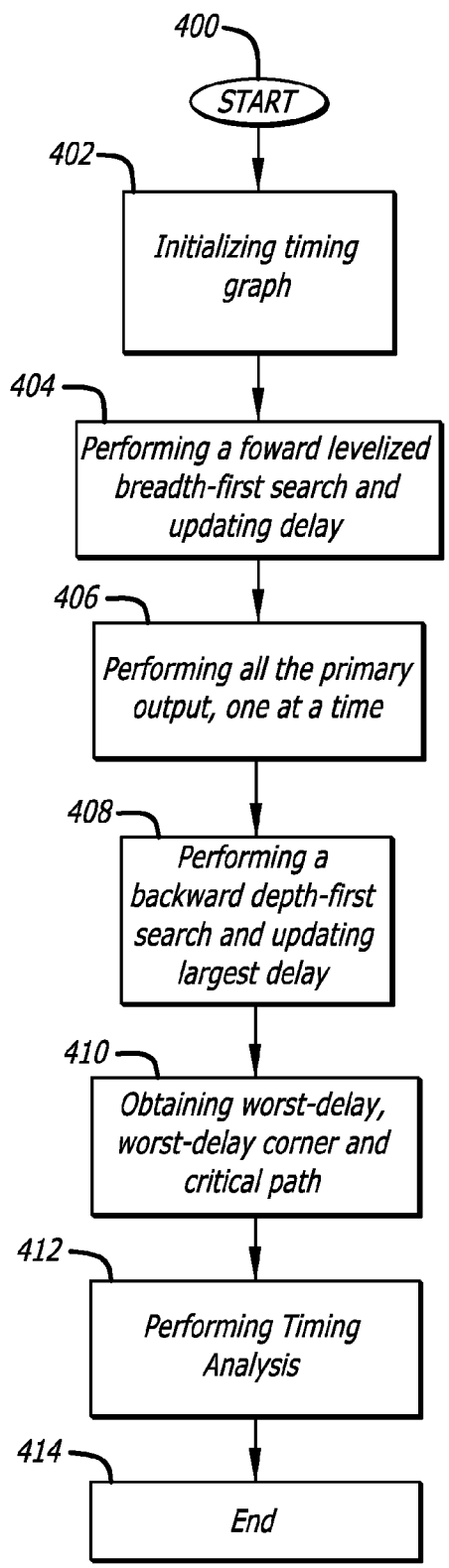
FIG. 4 is a flow chart diagram showing application of Branch-and-Bound technique in path and parameter space exploration.

FIG. 4 is a flow chart diagram showing application of Branch-and-Bound technique in path and parameter space exploration. FIG. 2 illustrates an exemplary flow chart of path space exploration. FIG. 3 illustrates an exemplary flow chart of parameter space exploration.

FIG. 8 illustrates pseudocode for the algorithm is presented as function WDC-PATH-BNB and corresponds to the flow chart illustrated in FIG. 2. The algorithm receives the timing graph G as an argument (process 101) and returns (process 214) a tuple containing the delay value for the worst-delay corner, w*, as well as the worst corner assignment $\Delta\lambda^*$ for the parameter variation vector, $\Delta\lambda^*$, that produced it, and the computed critical path.

At process 400, the algorithm starts and then goes to process 402 initializing the timing graph. This corresponds to invoking INITIALIZE on the timing graph G in the pseudocode. The worst case delay w* is initialized to zero and the algorithm starts with an empty parameter list (process 202). At process 404, a forward levelized breadth-first traversal of the timing graph is performed, starting at the primary inputs and ending at the primary outputs. For each vertex v, it computes, the parametric formula for the delay estimate $d_v^{in}$, that is an upper bound on the delay from any primary input to the vertex v.

After completing the initializations, the algorithm processes all the primary outputs, one at a time (process 406). A primary output is selected (process 203), the process invokes the recursive function PROCESS-VERTEX (process 204) that performs a backwards depth-first traversal of the timing graph towards the primary inputs (process 408) to compute a worse case delay w. At each step, a given vertex v is visited (the current vertex), and one of its fanins is scheduled to be visited in the next step. Therefore, the current vertex v is always connected to the active primary output by the incomplete path used to reach the current vertex v, that has been defined as a trail. All the vertices in the trail were visited before the current vertex v. For a given vertex v, the delay of the trail, $d_v^{out}$, is computed by adding the delay of all the edges in the trail. That computation is implicitly performed in PROCESS-VERTEX. Adding the upper bound on the delay from primary input PI to the selected vertex $d_v^{in}$ and the delay of the trail $d_v^{out}$ together (process 204), we obtain an upper bound on the delay of any path, $d_v^{path}$, that contains the current vertex v, starts at any primary input, and reaches the primary output trough the trail. The upper bound on the delay of the path $d_v^{path}$ is an affine function of the parameter variations. The worst value for the upper bound on the delay of the path $d_v^{path}$ and the corresponding vector of parameter variation settings is computed using Eqns. (4) and (5). If this computed delay, w, is smaller than the largest known delay, w*, computed so far (process 208), that means that the worst-delay path does not contain the trail, and therefore the traversal at this vertex is stopped and then goes to process 212. If the w is larger than w*, and v is a primary input, it means that there is a complete path with delay larger than the largest known delay computed so far, and therefore the largest known delay is updated, the largest known delay w* is set to equal to the current computed delay w and the worst known process parameter variation settings Δλ* are set equal to the current process parameter variation settings Δλ. If the current vertex is not at a primary input, the delay estimate is just an upper bound, and therefore the largest known delay is not updated. This is continued until all the paths in the circuit are explicitly or implicitly explored through the primary outputs. If a primary output remains to be explored (process 212), process 203 is repeated to select one of the remaining primary outputs. With no further primary outputs to explore the process goes to process 214. At the end of process 410, the largest known delay w* and the corresponding parameter variation settings, Δλ*, are set to be the worst delay of the circuit and the worst-delay corner, respectively (process 214). One or more critical paths can also be computed (process 214) with the worst delay of the circuit and the worst-delay corner. With this information, an improved timing analysis process 412 may be performed (process 110A).

Referring now to FIGS. 10A and 11, an exemplary timing graph 1100 is illustrated for an exemplary combinational circuit upon which the algorithm may be performed. The timing graph 1100 includes a plurality of vertices including a plurality of primary inputs 1101A-1101D (generally referred to as PI 1101), a primary output PO 1102, internal vertices 1103-1004, and delay edges 1112A-1112B, 1113A-1113B, and 1114A-1114B.

Note that if the threshold path delay is determined by a complete path delay, the current worse case path delay w* may be updated when a complete path delay is determined and not just an inaccurate upper bound of timing delay for the path using the upper bounds of delay at vertices. For example if primary input vertex a 1101A is the selected vertex, the complete path from primary input vertex a 1101A to primary output vertex g 1102 may update the value of the current worse case path delay w* as when it is analyzed its trail (edges 1113A and 1112A) is a complete path. The path delay of the given vertex $d_v^{path}$ is equal to the trail delay of the path as the trail is a complete path and the upper bound of the fan-in cone is zero without any fan-in paths.

Note further that with the given time delays in the timing graph 1100, the fanin cone of internal vertex f 1104 need not be analyzed because the upper bound of path delays through vertex f is less that the current worse case path delay w* (w≦w*). This allows a portion of the path space for the timing graph 1100 to be pruned, namely path {<c,f>, <f,g>} including edges 1114A, 1112B and path {<d,f>, <f,g>} including edges 1114B, 1112B.

FIG. 10B tabulates the information that may be gleaned from the exemplary timing graph 1100 illustrated in FIGS. 10A and 11.

Assuming late mode and upper bounds of timing delay, tracing forward through the timing graph 1100 from the primary input vertices 1101 to the primary output vertex g 1102, the upper bound of timing delay is computed for each vertex. Without any incoming edges, the upper bound of timing delay for the primary input vertices a-d 1101A-1101D is zero. At internal vertex e 1103, the timing delay for edge 1113A between vertex a 1101A and vertex e 1103 is computed as a function of the parameters and determined to be $3+\Delta\lambda_1+\Delta\lambda_2$, for example. Note that the functions may be constructed, without loss of generality, in such a way that the parameters can be assumed to lie in the interval [0,1]. The timing delay for edge 1113B between vertex b 1101B and vertex e 1103 is computed as a function of parameters and determined to be 3, for example. A comparison is made between the timing delays for the fan-in paths or edges 1113A and 1113B to determine an upper bound of timing delay at the internal vertex e 1103. With the example values in this case, the upper bound of timing delay at the internal vertex e 1103 may be determined to be $3+\Delta\lambda_1+\Delta\lambda_2$ as the components of the timing delay for edge 1113A are all greater than 3, the component of the timing delay for edge 1113B. The upper bound of timing delay at the internal vertex f 1104 may be similarly determined to be $2+2\Delta\lambda_1-\Delta\lambda_2$.

The upper bound of timing delay at the primary output vertex g 1102 is a little more complex as the internal vertices 1103 and 1104 have upper bounds of timing delay to consider. For the fan-in path 1112A, an upper bound of timing delay is the sum of the upper bound of timing delay at internal vertex 1103 and the time delay of the fan-in edge 1112A. Using the exemplary values, the upper bound of timing delay for the fan-in edge 1112A is the sum of $3+\Delta\lambda_1+\Delta\lambda_2$ and $2-\Delta\lambda_1+\Delta\lambda_2$ which is $5+2\Delta\lambda_2$. Similarly, using the exemplary values, the upper bound of timing delay for the fan-in edge 1112B is the sum of $2+2\Delta\lambda_1-\Delta\lambda_2$ and $1+\Delta\lambda_1-\Delta\lambda_2$ which is $3+3\Delta\lambda_1-2\Delta\lambda_2$. To determine the upper bound for the vertex g 1102, the upper bound of timing delay for the fan-in paths through edge 1112A and vertex e 1103 and the upper bound of timing delay for the fan-in paths through edge 1112B and vertex f 1104 are compared and a new upper bound computed. Using the exemplary values, the bound $5+2\Delta\lambda_2$ is compared with the bound $3+3\Delta\lambda_1-2\Delta\lambda_2$ to determine (i) a new bound, which could be $5+3\Delta\lambda_1+2\Delta\lambda_2$ for example, and (ii) the upper bound for the vertex g 1102. Note that the bounds need not be computed component-wise as is done in this example. Now that an upper bound of timing delay is known for each vertex, branch and bound techniques may be used to prune the set of paths in the path space from consideration of being one or more worse case paths in the circuit.

For the purposes of pruning with branch and bound procedures, a threshold may be used to compare against computed values. For the path space, a threshold path delay may be used to compare against computed path delays in the circuit. The threshold path delay may be a user provided value, a predetermined value, or an updatable computed value responsive to the circuit or the circuit and the one or more circuit parameters. If computed, a first complete path is selected between a primary input and a primary output. The timing delay through the complete path is computed by summing timing delay edges along the complete path together as an initial time delay value of the threshold path delay. As further complete paths are analyzed to determine their complete timing delays and not just an upper bound, the initial or current time delay value for the threshold path delay may be updated if another complete path has a time delay value greater than the current time delay value.

Moreover, the worse parameter corners may be used to evaluate the upper bounds of timing delay as well as the complete path delays that are affine or convex functions of circuit parameters. The circuit parameters are variables that influence behavior of the circuit being analyzed, particularly its timing behavior. The circuit parameters in the affine or convex functions of timing delay may be one or more process parameters, one or more environmental parameters, one or more design parameters, or any combination thereof. Exemplary process parameters, are width and/or length of lines, height or thickness of layers of semiconductor processing materials, dielectric properties of the material layers, etc. Exemplary environmental or operational parameters include temperature, power supply voltages, internal biasing voltages, etc. Exemplary design parameters include design widths and lengths of lines, sizes of electronic devices, biasing conditions, etc.

Referring now back to FIGS. 10A-10B and 11, a vertex is selected from which to evaluate complete paths and the pruning of paths in the path space when compared against the threshold path delay. One way of selecting a vertex to evaluate paths, is to start with the primary output vertex and trace backwards from there to the primary inputs. If the primary output is selected to be the selected vertex for evaluation, its trail path is nil. However an internal vertex, such as internal vertex 1103, may be initially selected for evaluation of paths.

Assume that primary output vertex g 1102 is the selected vertex for evaluation. Recall that with the primary output vertex g 1102 being the selected vertex, there is no tail path. The primary output vertex g 1102 has two fan-in cones. We start by exploring along one of the fan-in paths. For example we may pick the edge 1112A to explore backwards along. The first vertex e 1103 is encountered. All paths in the fan-in cone through vertex e 1103 have a delay bounded by the sum of the tail $2-\Delta\lambda_1+\Delta\lambda$, which comes from the edge 1112A, and the bound $3+\Delta\lambda_1+\Delta\lambda_2$ at vertex e 1103. We compare a bound on this sum, for instance $5+2\Delta\lambda_2$, to the current threshold. For example, if the current threshold was provided to be 8, then there is no setting of the parameters (assuming as before normalization of the parameter in the range [0,1]) for which the bound exceeds the threshold. Therefore it is not necessary to further explore the fan-in cone of vertex e 1103. Suppose on the other hand that the threshold was 6.5. Then, the fan-in cone of vertex e 1103 must be further explored.

Consider exploration of the timing graph along edge 1113A from vertex e 1103. There is now a complete path <a,e>, <e,g>. The delay along this path is $5+2\Delta\lambda$ whose worst case is 7. In this example, the timing delay value 7 exceeds the current threshold value of 6.5. This path must be kept as a worst case path candidate. If the goal is to find all paths with delay worse than the given threshold 6.5, then this path is annotated and kept, but the threshold is not updated. If the goal is to determine the worst case path, then the path is annotated and the threshold is updated to the current worst value, in this case 7. Other cases (e.g. finding the Nth worst case) are handled similarly.

Next we must explore the timing graph along edge 1113B from vertex e 1103. With edge 1113B a complete path <b,e>, <e,g> is formed between the primary input 1101B and the primary output 1102. The delay along this path is $5-\Delta\lambda_1+\Delta\lambda_2$. As the worst case for this expression is 6, for no value of the parameter settings does a delay on this path exceed the current threshold (depending on the goal, the current threshold may be either the fixed 6.5 or the updated 7 from the previous step). Therefore this path can be discarded or pruned from the path space for consideration of a worse case path.

Having explored the fan-in to vertex g 1102 along edge 1112A, we now explore along the fan-in cone to vertex g 1102 along the remaining edges. There is only one vertex in the remaining immediate fan-in of vertex g 1102, through edge 1112B. The remaining vertex is vertex f 1104. All paths through this vertex have a delay bounded by the sum of $2+2\Delta\lambda_1-\Delta\lambda_2$, the bound on path fan-ins to vertex f 1104, and $1+\Delta\lambda_1-\Delta\lambda_2$, the bound on delay of edge 1112B. A bound on this sum is $3+3\Delta\lambda_1-2\Delta\lambda_2$. The worst-case value of this expression is 6. This does not exceed the threshold previously computed. Therefore, no further paths need to be explored. In particular, no paths that fan-in to vertex f 1104 need be explored.

The path search algorithm iterates through each and every primary output vertex in the combinatorial circuit. It may then choose the parameter corner that produces the worst delay among all primary outputs. To simplify matters, an alternative technique may be used to determine the worst timing delay among all primary output vertices.

Figure 18A:
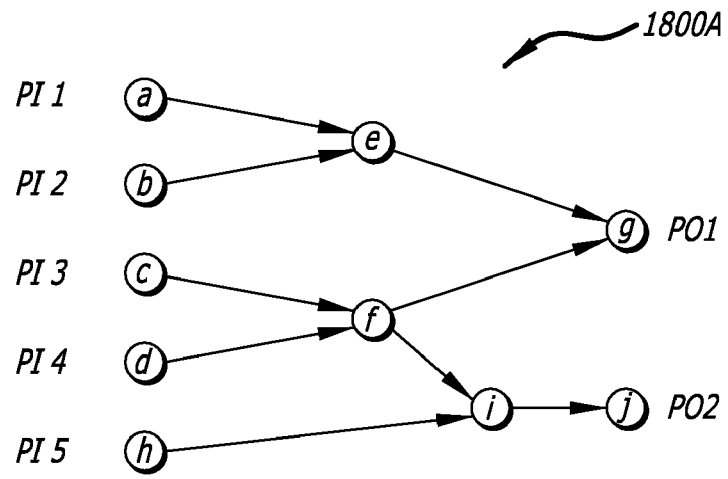
FIG. 18A is an exemplary timing graph with a plurality of primary inputs and a plurality of primary outputs.

Referring now to FIG. 18A, an initial timing graph 1800A is illustrated having a plurality of primary inputs PI1-PI5 and a plurality of primary outputs PO1 and PO2. The initial timing graph 1800A may be modified to more simply determine the worst timing delay among all primary output vertices PO1 and PO2.

Figure 18B:
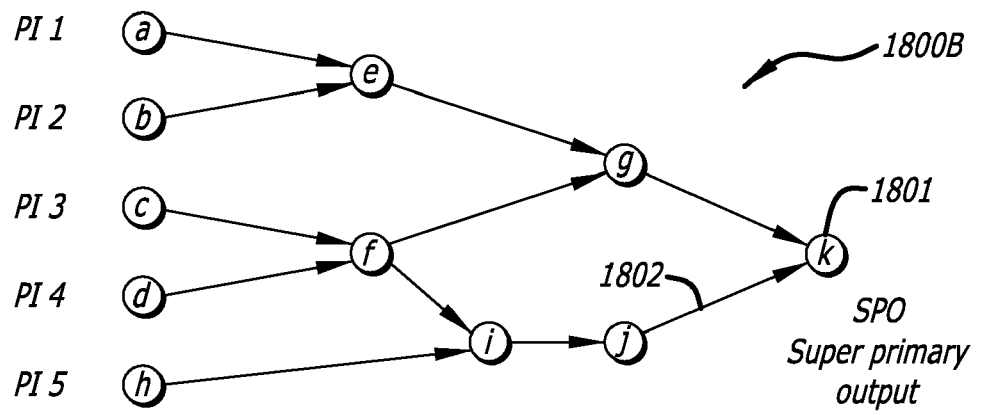
FIG. 18B is a modified timing graph from that of FIG. 18A to form a super primary output to simplify the search for a worst case path in a circuit.

Referring now to FIG. 18B, a modified timing graph 1800B is illustrated having the plurality of primary inputs PI1-PI5 and a super-sink vertex or a super primary output SPO. The super primary output SPO is added to more simply determine the worst timing delay among all primary output vertices PO1 and PO2. The plurality of primary outputs PO1 and PO2 are coupled to the super primary output SPO by each of the timing delay edges 1802. The timing delay in each of the timing delay edges 1802 is set to zero so that it will not effect the timing of the circuit.

The path search algorithm, instead of having to iterate through each and every primary output vertex, need only analyze one super primary output vertex SPO to determine the worst timing delay among all primary output vertices PO1 and PO2. With this modification to the timing graph, the path search algorithm functions as described previously but with one super primary output vertex SPO being used to define the complete paths and determine the worst case timing and worst case path in the circuit.

Branch-and-Bound algorithm for Parameter Space Searches

The embodiments of the invention may use another branch-and-bound algorithm for computing the worst-delay corner by exploring the parameter space. By analyzing the worst delay obtained for specific assignments of the parameter variation vector, the algorithm is able to effectively prune regions of the parameter space. In this context the timing graph is only be used to compute worst delay estimates for a given partial or complete assignment of the parameter variation vector. For partial assignments only an upper bound on the worst delay is computed and for complete assignments, the exact value of the worst delay is obtained.

FIG. 3 illustrates a flow chart for parameter space exploration.

The pseudo code for the proposed algorithm has been presented in FIG. 12 as function WDC-PARAMETER-BNB and corresponding flow chart is presented in FIG. 3 that receives and returns improved timing analysis information similar to the WDC-PATH-BNB algorithm. Similar to pruning paths with the WDC-PATH-BNB algorithm, the WDC-PARAMETER-BNB algorithm prunes useless regions of the parameter variation space by analyzing the worst delay produced by certain partial and complete assignments of the parameter variation vector. In order to keep track of all the partial and complete assignments already analyzed, a binary tree is used, commonly designated by decision tree (DT). Each node in the decision tree represents one element of the parameter variation vector and has at most a left and right child. Each child is a sub-tree. The left child represents a partial or a complete assignment of the parameter variation vector where the corresponding element assumes value 1. For the right child this value is 0. The leafs of the tree are the delay estimates computed considering the parameter variation vector assignments in the upper levels. Therefore, when a leaf is at level p+1 and root of the tree is at level 1, it means that it corresponds to a complete assignment, and therefore it contains an exact worst delay. On the other hand, when a leaf is at level k<p, it means that it corresponds to a partial assignment, and therefore it contains an upper bound on the worst delay.

The worst case delay w* is initialized to zero and the algorithm starts with an empty parameter list (process 302). The algorithm then calls a DT-INIT process that initializes the data structures for the decision tree (process 302). Afterwards it enters a cycle, where for each iteration the function DECIDE, based on the current state of the decision tree, and the regions of the parameter variation space that need to be explored, a partial or complete assignment, Δλ, is selected for the parameter variation vector (process 303). This assignment is also annotated to the decision tree by the DT-REGISTER-DECISION (process 303). Subsequently, the worst delay estimate for this assignment is computed by WORST-DELAY (process 306), and stored in w. If the worst delay estimate w is smaller or equal to the largest known delay estimate achieved so far, w*, (process 310) it means that any assignment contained in the partial assignment Δλ does not provide an improvement over w* and is therefore simply ignored. In order to prevent DECIDE from further exploring this region of the parameter variation space, called DTREGISTER-PRUNE that inserts a marker in the decision tree. No further expansion is performed beyond this node, effectively pruning the subtree from consideration in the decision tree (process 312). If the worst delay estimate is larger than the largest known delay estimate computed so far (process 310) and Δλ is a complete assignment, it means that Δλ improves the largest known delay estimate and therefore w* is updated by setting the worst known delay w* to be the computed delay w (process 311). If the worst delay estimate is larger than the largest known delay estimate computed so far, but Δλ is only a partial assignment, no conclusion is drawn, since the worst delay estimate obtained for a partial assignment is just an upper bound, whose value will eventually get smaller as new elements of the parameter variation vector are assigned. The algorithm proceeds until all the regions of the parameter space (e.g. all possible parameter variation vector assignments) are either explicitly explored or pruned. A determination is made if the parameter space is completely explored (process 314). If the parameter space remains to be explored (process 314), process 303 is repeated to select another parameter assignment to further explore the parameter space. With no further parameter space to explore, the process goes to process 316. At process 316, the largest known delay w* and the corresponding parameter variation settings, Δλ*, are set to be the worst delay of the circuit and the worst-delay corner, respectively. One or more critical paths can also be computed (process 316) with the worst delay of the circuit and the worst-delay corner. With this information, an improved timing analysis process may be performed (process 110B).

Figures 13A, 13B:
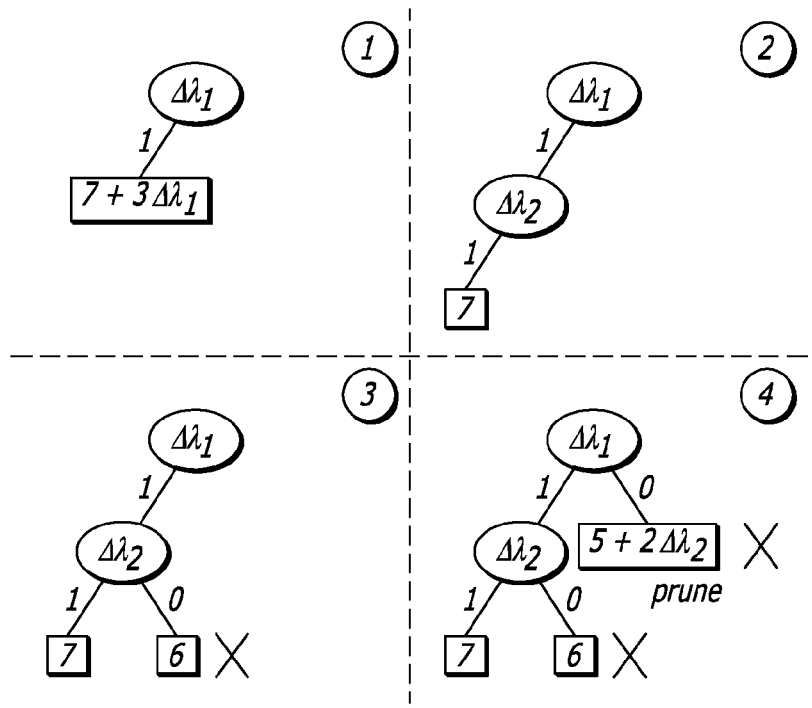
FIG. 13A is a diagram illustrating the progression of an exemplary tree diagram and parameter space exploration corresponding to a circuit of the exemplary timing graph of FIGS. 10A and 11.
FIG. 13B is a table of values corresponding to the exemplary tree diagram of FIG. 13A.
Figures 14A, 14B:
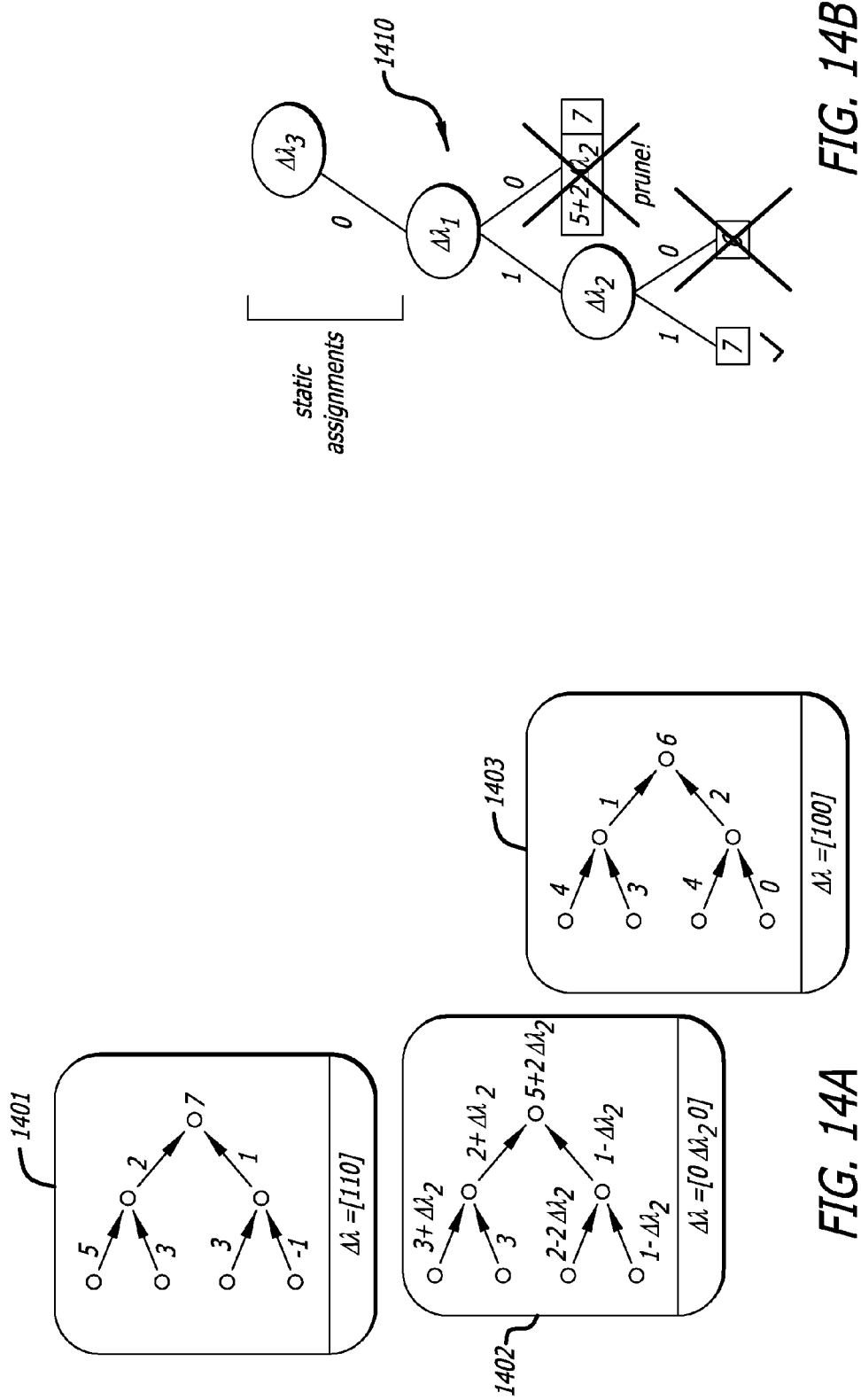
FIG. 14A illustrates exemplary tree diagrams for different parameter corners used in conjunction with the exemplary timing graph of FIGS. 10A and 11.
FIG. 14B illustrates an exemplary tree diagram for a parameter space to show a corner search with pruning of the parameter corners in the parameter space.

FIGS. 13A and 14A-14B illustrate the progressive formation and pruning of a decision tree produced by the execution of the algorithm for the timing graph in FIGS. 10A and 11. FIGS. 14A-14B include an extra parameter Δλ$_3$ which is a static assignment of 0 as it has no effect on the exemplary circuit. FIG. 13B illustrates a table of the delay estimates, which are upper bounds for partial parameter variation assignments, and are exact delay estimates for complete assignments. In steps (1) and (2) a complete parameter variation assignment, Δλ=<1,1> has been generated in order to obtain the first estimate for current worse case delay w*, which is the number 7. In step (3) the complete assignment Δλ=<1,0> has been analyzed and that it produces a delay of 6, which is smaller than the current w*=7. In step (4) the partial assignment Δλ=<0,X> has been analyzed and concluded that it produces a delay of 5+2Δλ2, that in the worst case assumes value 7. Since this delay is equal to the largest known delay found so far, the remaining subtree is discarded. This effectively prunes part of the parameter variation space, namely assignments <0,1> and <0,0>. After this all the parameter variation space has been explored, and the final solution is w*=7 and Δλ*=<1,1>.

For the purposes of pruning with branch and bound procedures, a threshold may be used to compare against computed values. For the parameter space, a threshold time delay may be used to compare against computed time delays for various parameter corners of the overall time delay of the circuit. The threshold time delay may be a user provided value, a predetermined value, or an updatable computed value. If an updatable computed value, the value may be responsive to a circuit or the circuit and one or more parameter corners.

Sequential Circuits and Branch and Bound Techniques

Much of the prior description assumed a combinational circuit but is equally applicable to synchronous circuits with some modifications to the timing graph. Additionally, specific nodes may be subject to timing constraints. The embodiments of the invention can analyze how to compute the worst corner induced by each of the Fixed Arrival Time Constraints and Setup & Hold time Constraints.

Slacks are induced by required arrival time (RAT) constraints in specific circuit pins. If RATs are constant values, finding the setting of parameter variation values that produces the minimum slack in a pin is equivalent to finding the setting of parameter variation values that produces the largest delay in one of the pins where these constraints exist. Therefore algorithm is used to compute the parameter settings that produce the worst delay in every pin with RAT constraints. Among these pins, those parameter settings for the pin are chosen where the slack is the smallest. Therefore, computing the worst-slack corner amounts to a sequence of worst-delay corner computations.

Figure 15A:
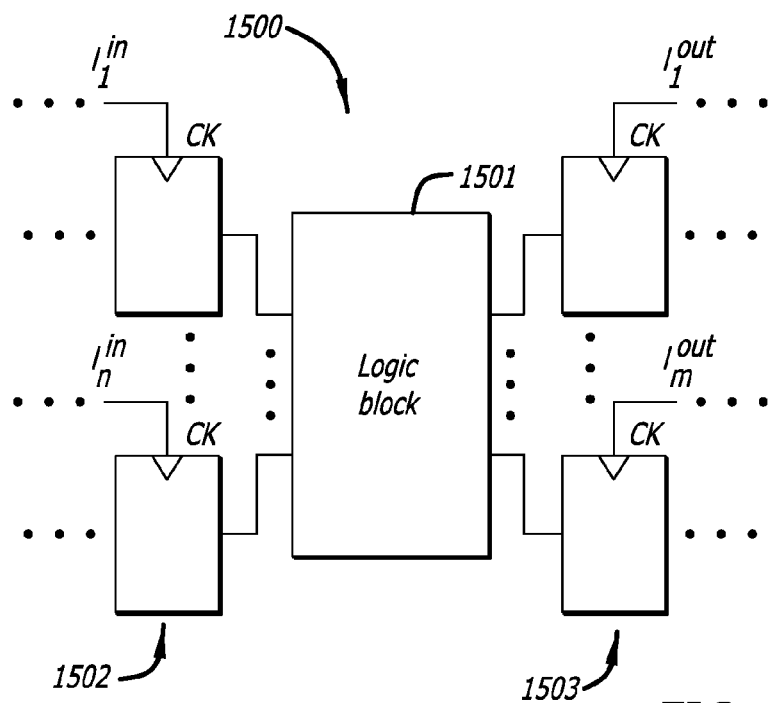
FIG. 15A is a functional block diagram of an exemplary sequential circuit.

Referring now to FIG. 15A, sequential circuits 1500 generally consist of combinational logic blocks 1501 interleaved between input register banks 1502 and output register banks 1503. There may be several stages of sequential circuits. A register bank may capture data from the primary outputs of a first logic block 1501 and then inject it into the primary inputs of the next logic block 1501 in the next stage. Register operation is synchronized by clock signals CK generated by one or multiple clock sources. For several reasons, including wire propagation delay, clock signals CK that reach the registers are delayed from the original clock signal. This delay is termed clock latency, and assumes distinct values for different registers. Over a clock period of T, the data is injected into a logic block 1501 by a bank 1502 of n registers with parametric latencies $l_1^{in}(\Delta\lambda), \ldots, l_n^{in}(\Delta\lambda)$, respectively, and captured by a bank 1503 of m registers with parametric latencies $l_1^{in}(\Delta\lambda), \ldots, l_n^{in}(\Delta\lambda)$, respectively as illustrated in FIG. 15A. Since the clock network is usually a tree, where large portions are shared among multiple paths, it is feasible to accurately compute the clock latencies l through a path-based analysis.

Figure 15B:
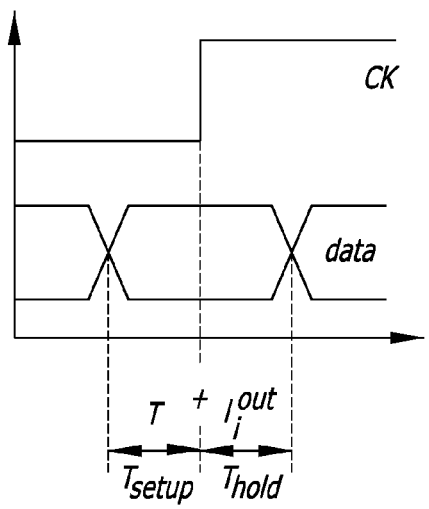
FIG. 15B is a waveform diagram illustrated a data waveform and a clock waveform to illustrate setup time and hold time for determining setup slack and hold slack in a sequential circuit.

Referring now to FIG. 15B, in order for a register to be able to properly capture the data on the clock edge, the input data line is stable for a specific period of time before the clock edge. This period of time is designated by setup time, and represent by $t_{setup}$. For example, when a register i, connected to a primary input of the logic block, is injecting data, and a register j, connected to a primary output of the logic block, is capturing the result and the clock edge is generated in the clock source at time 0, then it will reach the injecting register at time $l_i^{in}$, making the data available at the primary input of the logic block. If the propagation delay through the logic block in late mode (i.e. considering that the output of a cell is changed by the last input that changed), from input i to output j, is $d_{i,j}^{late}$, then the result is available at the output at time $l_i^{in}+d_{i,j}^{late}$. The next clock edge will reach the capturing register at time $T+l_j^{out}$. For a correct operation, the results must be available at the primary outputs of the logic block $t_{setup}$ before the clock edge reaches the capturing register. Therefore, for proper register operation the following setup timing condition expressed by the inequality of equation 6 exists:

$$l_i^{in}+d_{i,j}^{late} \leq T+l_j^{out}-t_{setup} \quad (6)$$

For proper operation, this condition is valid for each and every ⟨i, j⟩ input/output register pair. For a given output register j a set of constraints may be expressed by equation 7 as follows:

$$\max_{i=1,\ldots,n}(l_i^{in}+d_{i,j}^{late}) \leq T+l_j^{out}-t_{setup} \quad (7)$$

The set of constraints expressed by equation 7 induces a setup slack timing, $s_i^{setup}$, that may be defined by equation 8 as follows:

$$s_i^{setup} = T+l_j^{out}-t_{setup}-\max_{i=1,\ldots,n}(l_i^{in}+d_{i,j}^{late}) \quad (8)$$

The setup slack timing $s_i^{setup}$ is non-negative when the conditions are met and negative otherwise. The worst-setup-slack corner for setup slack timing $s_i^{setup}$ is the corner where its value is minimized. This may be expressed by equation 9 as follows:

$$\min_{\Delta\lambda}(s_{i,j}^{setup}) = \max_{\Delta\lambda}(-s_{i,j}^{setup}) = \max_{\Delta\lambda}\left(\max_{i=1,\ldots,n}(l_i^{in}+d_{i,j}^{late})-T-l_j^{out}+t_{setup}\right) \quad (9)$$

Figure 16A:
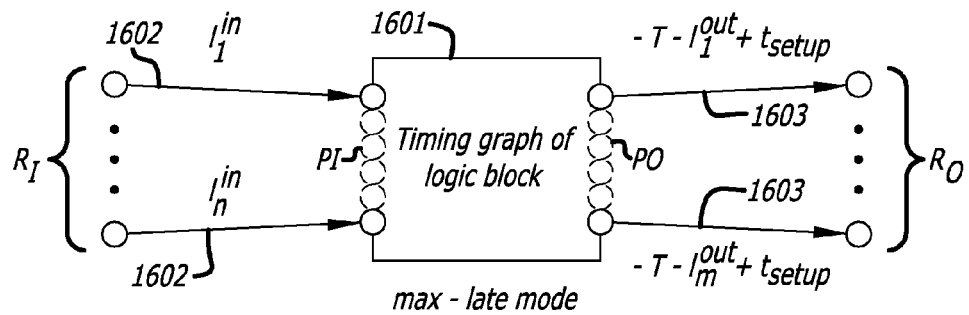
FIG. 16A is a modified timing graph to model setup constraints of sequential circuits.

This condition may be computed by the worse case corner search (find) algorithm outlined previously, if the timing graph 1601 for the combination functional block 1501 is modified as illustrated in FIG. 16A and computed for late mode timing.

Referring now to FIG. 16A, one or more registered inputs (RI) are added to the timing graph 1601 of the circuit with timing delay edges 1602 each having a clock input latency $l_n^{in}$. The one or more registered inputs (RI) are respectively coupled to the one or more primary inputs (PI) by the timing delay edges 1602. Additionally, one or more registered outputs (RO) are added to the timing graph 1601 of the circuit with timing delay edges 1603 each having a timing delay that includes a register timing $(-T+t_{setup})$ and a clock output latency rut $l_m^{out}$. In this case, each timing delay is the difference between the register timing $(-T+t_{setup})$ and the clock output latency $l_m^{out}$, or $(-T-l_m^{out}+t_{setup})$. The one or more registered outputs (RO) are respectively coupled to the one or more primary outputs (PO) by the timing delay edges 1603. With this modification, a plurality of paths of a path space are formed between the one or more registered inputs (RI) to the one or more registered outputs (RO).

Referring now back to FIG. 15B, for correct operation of a register, the input data line should be stable for a certain period of time after the clock edge. This period of time is designated hold time, and represented by $t_{hold}$. As before, for example when a register i, connected to a primary input of the logic block, is injecting data, and a register j, connected to a primary output of the logic block, is capturing the result and register i injects into the logic block new data at time $l_i^{in}$, than the corresponding new result is available at the input of register j as soon as $l_i^{in}+d_{i,j}^{early}$, where $d_{i,j}^{early}$ is the propagation delay through the logic block in early mode, from input i to output j. For a correct operation, the new results is not available at the input of register j before the hold time from the previous cycle is observed. Therefore, the following condition expressed by equation 10 is valid for proper register operation:

$$l_i^{in}+d_{i,j}^{early} \geq l_j^{out}+t_{hold} \quad (10)$$

For proper register operation, this condition is valid for every ⟨i, j⟩ input/output register pair. For a given output register j, these sets of constraints may be expressed by equation 11 as follows:

$$\min_{i=1,\ldots n}(l_i^{in}+d_{i,j}^{early}) \geq l_j^{out}+t_{hold} \quad (11)$$

This expression induces a hold slack, $s_i^{hold}$, that may be defined by equation 12 as follows:

$$s_i^{hold} = \min_{i=1,\ldots n}(l_i^{in}+d_{i,j}^{early})-l_j^{out}-t_{hold} \quad (12)$$

The hold slack $s_i^{hold}$ is non-negative when the conditions are met and negative otherwise. The worst-slack corner for $s_i^{hold}$ is the corner where its value is minimized and may be expressed in equation 13 as follows:

$$\min_{\Delta\lambda}(s_{i,j}^{hold}) = \min_{\Delta\lambda}\left(\min_{i=1,\ldots n}(l_i^{in}+d_{i,j}^{early})-l_j^{out}-t_{hold}\right) \quad (13)$$

Figure 16B:
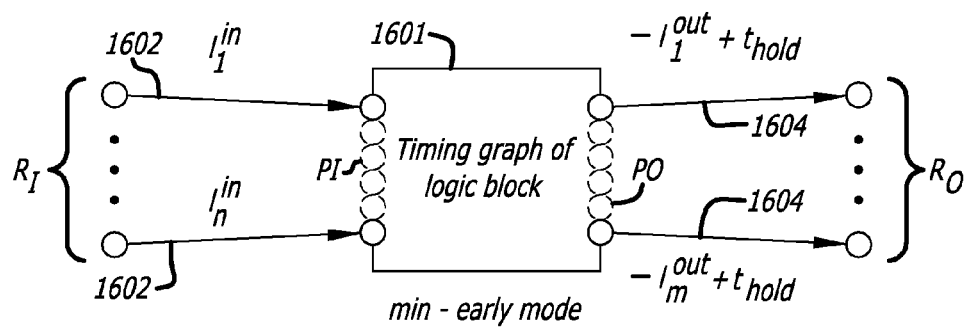
FIG. 16B is a modified timing graph to model hold constraints of sequential circuits.

This condition may be computed by the corner search (find) algorithm outlined previously, if the original timing graph is modified as illustrated in FIG. 16B, and if the minimum lower bounds is computed for early mode instead of computing maximum upper bounds for late mode.

Referring now to FIG. 16B, one or more registered inputs (RI) are added to the timing graph 1601 of the circuit with timing delay edges 1602 each having a clock input latency $l_n^{in}$. The one or more registered inputs (RI) are respectively coupled to the one or more primary inputs (PI) by the timing delay edges 1602. Additionally, one or more registered outputs (RO) are added to the timing graph 1601 of the circuit with timing delay edges 1604 each having a timing delay that includes a register timing $(t_{hold})$ and a clock output latency $l_m^{out}$. In this case, each timing delay the difference between the register timing $(t_{hold})$ and the clock output latency $l_m^{out}$, or $(-l_m^{out}+t_{setup})$. The one or more registered outputs (RO) are respectively coupled to the one or more primary outputs (PO) by the timing delay edges 1604. With this modification, a plurality of paths of a path space are formed between the one or more registered inputs (RI) and the one or more registered outputs (RO).

Computing System

Figure 19:
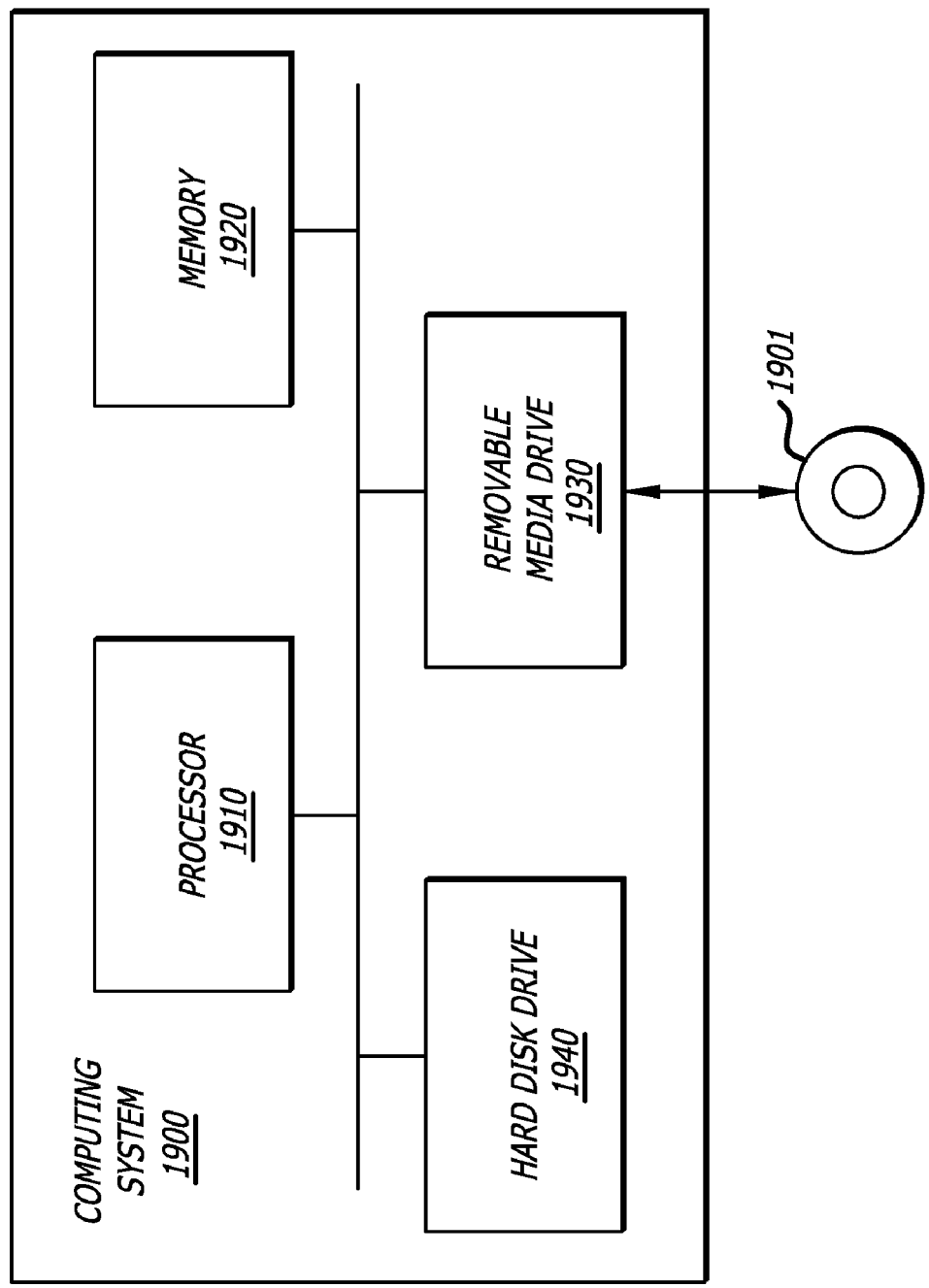
FIG. 19 illustrates an exemplary embodiment of a computing system usable with embodiments of the invention.

Referring now to FIG. 19, a computing system 1900 is illustrated that may be used to perform some or all of the processes in accordance with a number of embodiments of the invention. In one embodiment of the invention, the computing system 1900 includes a processor 1910, a memory 1920, a removable media drive 1930, and a hard disk drive 1940. In one embodiment, the processor 1910 executes instructions residing on a machine-readable medium, such as the hard disk drive 1940, a removable medium 1901 (e.g., an optical medium (compact disk (CD), digital video disk (DVD), etc.), a magnetic medium (magnetic disk, a magnetic tape, etc.), or a combination of both. The instructions may be loaded from the machine-readable medium into the memory 1920, which may include Random Access Memory (RAM), dynamic RAM (DRAM), etc. The processor 1910 may retrieve the instructions from the memory 1920 and execute the instructions to perform the operations described above.

Note that any or all of the components and the associated hardware illustrated in FIG. 19 may be used in various embodiments of the system 1900. However, it should be appreciated that other configurations of the system 1900 may include more or less devices than those shown in FIG. 19.

Some portions of the preceding detailed description have been presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The embodiments of the invention also relate to an apparatus for performing the operations described herein. This apparatus may be specially constructed for the required purposes, or it may comprise a general-purpose computer selectively activated or reconfigured by a computer program stored in the computer.

When implemented in a computer program or software, the elements of the embodiments of the invention are essentially the code segments to perform the necessary tasks. The program or code segments can be stored in a computer or processor readable storage medium or transmitted by a computer data signal embodied in a carrier wave over a transmission medium or communication link. The "processor readable storage medium" may include any medium that can store or transfer information. Examples of the processor readable medium include an electronic circuit, a semiconductor memory device, a read only memory (ROM), a flash memory, an erasable programmable read only memory (EPROM), a floppy diskette, a CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc.

The processes and displays presented herein are not inherently related to any particular computer or other apparatus. Various general-purpose systems may be used with programs in accordance with the teachings herein, or it may prove convenient to construct a more specialized apparatus to perform the operations described. The structure for a variety of these systems will appear from the description herein. In addition, the embodiments of the invention are not described with reference to any particular programming language. It will be appreciated that a variety of programming languages may be used to implement the teachings of the invention as described herein.

CONCLUSION

Experimental results with a given circuit indicate that branch-and-bound techniques to search over the path space for the one or more critical paths and the process parameter space for the worst case parameter corners are effective in reducing CPU runtimes. It was observed that a parameter space search may consume more runtime than a path space search. It was further observed that if tighter timing bounds are used in the search of the path space of a circuit, the amount of searching over paths is slightly reduced as more pruning of paths may occur.

When implemented in software, the processes of the embodiments of the invention are essentially the code segments to perform the necessary tasks. The program or code segments can be stored in a processor readable medium or transmitted by a computer data signal embodied in a carrier wave over a transmission medium or communication link. The "processor readable medium" may include any medium that can store information. Examples of the processor readable medium include an electronic circuit, a semiconductor memory device, a read only memory (ROM), a flash memory, an erasable programmable read only memory (EPROM), a floppy diskette, a CD-ROM, an optical disk, or a hard disk. The code segments may be downloaded via computer networks such as the Internet, Intranet, etc. and can propagate over a transmission medium such as electronic network channels, optical fibers, air, electromagnetic, RF links, etc. for storage into the "processor readable medium".

The embodiments of the invention are thus described. While certain exemplary embodiments have been described and shown in the accompanying drawings, it is to be understood that such embodiments are merely illustrative of and not restrictive on the broad invention, and that the embodiments of the invention should not be limited to the specific constructions and arrangements shown and described, since various other modifications may occur to those ordinarily skilled in the art. Instead, the embodiments of the invention should be construed according to the claims that follow below.

What is claimed is:

1. An apparatus for electronic circuit design, the apparatus comprising:
one or more processors to execute machine readable instructions stored in a storage device to analyze a circuit design, the machine readable instructions stored in the storage device including
instructions to analyze a hierarchy of a netlist of a circuit to determine one or more primary inputs and a plurality of primary outputs of the circuit at an upper level, and one or more internal vertices of the circuit at lower levels between the one or more primary inputs and the plurality of primary outputs;

instructions to form a timing graph of the circuit including a plurality of timing delay edges representing timing delay between the one or more primary inputs, the one or more internal vertices and one or more of the primary outputs;

instructions to add a super primary output to the timing graph of the circuit with timing delay edges having zero timing delay coupled to the plurality of primary outputs to form a plurality of paths of a path space from the one or more primary inputs to the super primary output; and instructions, responsive to the timing delay of the plurality of timing delay edges, to dynamically prune paths of the plurality of paths using branch and bound techniques on bounds of timing delay that are a function of one or more circuit parameters to reduce the path space down to one or more critical timing paths of the circuit with a worse case metric of timing delay between the one or more primary inputs and the super primary output.

2. The apparatus of claim 1, wherein
the one or more circuit parameters are variables that influence behavior of the circuit; and
the function of the one or more circuit parameters for the bounds of timing delay is either an affine function of the one or more circuit parameters or a convex function of the one or more circuit parameters.

3. The apparatus of claim 2, wherein
the one or more circuit parameters are selected from one or more process parameters, one or more environmental parameters, one or more design parameters, or any combination thereof.

4. The apparatus of claim 1, wherein
the worse case metric of timing delay is a late mode with the one or more circuit parameters set to capture slower timing conditions, and
the instructions to dynamically prune paths of the plurality of paths using branch and bound techniques includes
instructions to select a primary output for analysis and to select a vertex along a selected path to the selected primary output not yet analyzed or pruned from a set of complete paths in the timing graph;
instructions to compute an upper bound of timing delay for all complete paths through a selected internal vertex including one or more fan-in paths of a fan-in cone to the selected internal vertex, if any, and a trail path from the selected internal vertex to the selected primary output; and
instructions to prune all complete paths, from the one or more primary inputs through the selected internal vertex from being considered as one or more worse case delay paths if the computed upper bound of timing delay for all of the complete paths through the selected internal vertex is less than or equal to a threshold path delay.

5. The apparatus of claim 4, wherein
the threshold path delay is a user provided value, a predetermined value, or an updatable computed value responsive to the circuit or the circuit and the one or more circuit parameters.

6. The apparatus of claim 4, wherein
a value of the threshold path delay is determined by instructions including
instructions to select a first complete path between a primary input and a primary output;
instructions to compute a timing delay through the first complete path by summing timing delay edges along the first complete path together as an initial time delay value of the threshold path delay; and
instructions to update the initial time delay value of the threshold path delay if another complete path has a time delay value greater than the initial time delay value.

7. The apparatus of claim 4, wherein
the instructions to compute the upper bound of timing delay includes
instructions to trace forward through the timing graph of the circuit to compute an upper bound of timing delay from the one or more primary inputs to each internal vertex of the one or more internal vertices, wherein the upper bound of timing delay represents the worse case timing delay of one or more fan-in paths from the one or more primary inputs to a respective internal vertex.

8. The apparatus of claim 1, wherein
the worse case metric of timing delay is an early mode with the one or more circuit parameters set to capture faster timing conditions, and
the instructions to dynamically prune paths of the plurality of paths using branch and bound techniques includes
instructions to select a primary output for analysis and to select a vertex along a selected path to the selected primary output not yet analyzed or pruned from a set of complete paths in the timing graph;
instructions to compute a lower bound of timing delay for all complete paths through a selected internal vertex including one or more fan-in paths of a fan-in cone to the selected vertex, if any, and a trail path from the selected vertex to the selected primary output; and
instructions to prune all complete paths, from the one or more primary inputs through the selected internal vertex from being considered as one or more worse case delay paths if the computed lower bound of timing delay for all of the complete paths through the selected internal vertex is greater than or equal to a threshold path delay.

9. The apparatus of claim 1, wherein the machine readable instructions stored in the storage device further include
instructions to analyze timing in the circuit using one or more parameter corners in a parameter space to determine a bound of timing delay of the circuit for the one or more parameter corners;
instructions to determine if the bound of timing delay is worse than a threshold time delay; and
instructions to prune the one or more parameter corners from the parameter space using branch and bound techniques if the bound of timing delay is worse than the threshold time delay.

10. A method for analyzing an integrated circuit design, the method comprising:
analyzing timing in a circuit using a plurality of parameter corners in a parameter space to determine a bound of timing delay of the circuit for the plurality of parameter corners;
determining if the bound of timing delay is worse than a threshold time delay; and if the bound of timing delay is worse than the threshold time delay, then pruning one or more parameter corners from the parameter space using branch and bound techniques, wherein one or more of the analyzing, the determining, and the pruning are performed with a processor.

11. The method of claim 10, wherein
the threshold time delay is a user provided value, a predetermined value, or a computed value responsive to the circuit and one parameter corner of the plurality of parameter corners in the parameter space.

12. The method of claim 11, wherein
the plurality of parameter corners are selected from one or more process parameter corners, one or more environmental parameter corners, one or more design parameter corners, or any combination thereof.

13. The method of claim 10, wherein
a value of the threshold timing delay is determined by
computing a new timing delay for the circuit using another parameter corner that is completely specified; and
updating the value of the threshold time delay to the new timing delay if the new timing delay is greater than a current value of the threshold timing delay.

14. The method of claim 10, wherein
the plurality of parameter corners are completely specified parameter corners of a plurality of parameter corners in a parameter space and have pairs of extreme values.

15. The method of claim 10, wherein
at least one parameter corner of the plurality of parameter corners is a partially specified parameter corner such that when it is pruned, at least one timing analysis is avoided for one extreme value of the at least one parameter corner to improve computing efficiency and reduce runtime.

16. The method of claim 10, wherein
a worse case timing delay for the circuit is an early mode, and
the bound of timing delay is a lower bound, and
if the lower bound of timing delay has an equal or a greater value than the threshold time delay, then one or more additional parameter corners are pruned from the parameter space.

17. The method of claim 10, wherein
a worse case timing delay for the circuit is a late mode,
the bound of timing delay is an upper bound, and
if the upper bound of timing delay has an equal or a lesser value than the threshold time delay then one or more additional parameter corners are pruned from the parameter space.

18. The method of claim 10, further comprising:
forming a search tree with edges representing parameter assignments, and nodes representing bounds on timing quantities over a portion of parameter space specified by the parameter assignments on the edges from a root of the search tree to each given node of the search tree; and
wherein the search tree is pruned below a respective node when pruning one or more additional parameter corners from the parameter space.

19. The method of claim 10, wherein
the bound of timing delay is a function of one or more circuit parameters.

20. The method of claim 19, wherein
the one or more circuit parameters are variables that influence behavior of the circuit; and
the function of the one or more circuit parameters for the bound of timing delay is either an affine function of the one or more circuit parameters or a convex function of the one or more circuit parameters.

21. The method of claim 20, wherein
the one or more circuit parameters are selected from one or more process parameters, one or more environmental parameters, one or more design parameters, or any combination thereof.

22. A machine readable product comprising:
a machine readable storage device having stored therein machine readable program instructions to analyze timing in a circuit using a plurality of parameter corners in a parameter space to determine a bound of timing delay of the circuit for the plurality of parameter corners;
machine readable program instructions to determine if the bound of timing delay is worse than a threshold time delay; and
machine readable program instructions to prune one or more parameter corners from the parameter space using branch and bound techniques if the bound of timing delay is worse than the threshold time delay.

23. The machine readable product of claim 22, wherein the machine readable storage device further has stored therein
machine readable program instructions to form a search tree with edges representing parameter assignments, and nodes representing bounds on timing quantities over a portion of parameter space specified by the parameter assignments on the edges from a root of the search tree to each given node of the search tree,
wherein the search tree is pruned below a respective node when pruning one or more additional parameter corners from the parameter space.

* * * * *